(12) United States Patent
Weyers et al.

(10) Patent No.: US 10,541,327 B2
(45) Date of Patent: Jan. 21, 2020

(54) SEMICONDUCTOR DEVICE COMPRISING A TRENCH STRUCTURE

(71) Applicant: Infineon Technologies Austria AG, Villach (AT)

(72) Inventors: Joachim Weyers, Hoehenkirchen (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/951,642

(22) Filed: Apr. 12, 2018

(65) Prior Publication Data

US 2018/0301553 A1   Oct. 18, 2018

(30) Foreign Application Priority Data

Apr. 13, 2017   (DE) .................. 10 2017 108 048

(51) Int. Cl.
| | | |
|---|---|---|
| *H01L 29/78* | (2006.01) |
| *H01L 27/02* | (2006.01) |
| *H01L 27/06* | (2006.01) |
| *H01L 29/66* | (2006.01) |
| *H01L 29/866* | (2006.01) |

(52) U.S. Cl.
CPC ...... *H01L 29/7813* (2013.01); *H01L 27/0255* (2013.01); *H01L 27/0629* (2013.01); *H01L 29/66734* (2013.01); *H01L 29/7808* (2013.01); *H01L 29/7811* (2013.01); *H01L 29/866* (2013.01)

(58) Field of Classification Search
CPC ........... H01L 29/7813; H01L 29/66734; H01L 29/7808; H01L 29/861; H01L 29/866; H01L 29/7811; H01L 27/0255; H01L 27/0629
See application file for complete search history.

(56) References Cited

U.S. PATENT DOCUMENTS

| | | | |
|---|---|---|---|
| 7,511,357 B2 | 3/2009 | Hshieh | |
| 7,952,137 B2 | 5/2011 | Lin et al. | |
| 8,004,009 B2 | 8/2011 | Hsieh | |
| 8,169,045 B2 | 5/2012 | Dibra et al. | |
| 2002/0050602 A1 | 5/2002 | Narazaki | |
| 2012/0292694 A1 | 11/2012 | Hsieh | |
| 2013/0075808 A1* | 3/2013 | Calafut | H01L 27/06 257/328 |
| 2013/0105950 A1 | 5/2013 | Bergemont et al. | |

(Continued)

FOREIGN PATENT DOCUMENTS

DE    102004021393 B4    6/2006

*Primary Examiner* — Mark W Tornow
(74) *Attorney, Agent, or Firm* — Murphy, Bilak & Homiller, PLLC

(57) ABSTRACT

A semiconductor device includes a trench structure extending into a semiconductor body from a first surface. The trench structure has a shield electrode, a dielectric structure and a diode structure. The diode structure is arranged at least partly between the first surface and a first part of the dielectric structure. The shield electrode is arranged between the first part of the dielectric structure and a bottom of the trench structure. The shield electrode and the semiconductor body are electrically isolated by the dielectric structure. Corresponding methods of manufacture are also described.

22 Claims, 13 Drawing Sheets

(56) References Cited

U.S. PATENT DOCUMENTS

| | | | |
|---|---|---|---|
| 2013/0328122 A1* | 12/2013 | Li | H01L 29/407 257/334 |
| 2014/0097863 A1* | 4/2014 | Zundel | H01L 22/34 324/762.01 |
| 2015/0041816 A1 | 2/2015 | Wood et al. | |
| 2015/0349091 A1* | 12/2015 | Yilmaz | H01L 29/66666 438/270 |

* cited by examiner

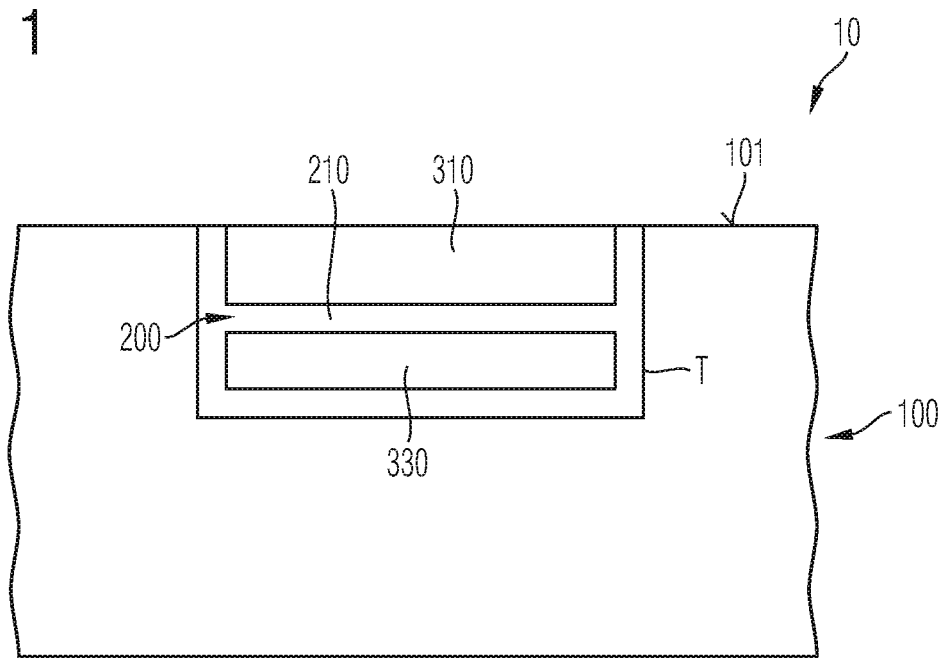

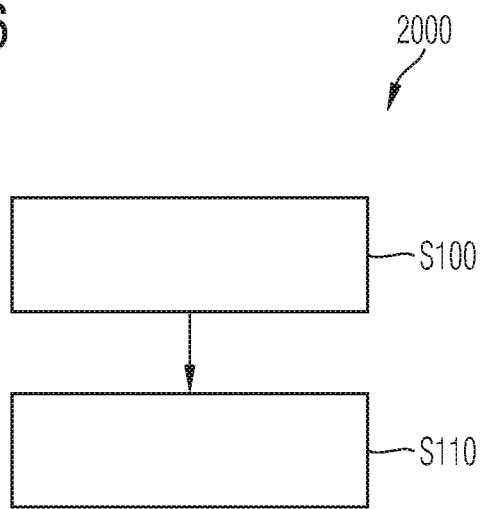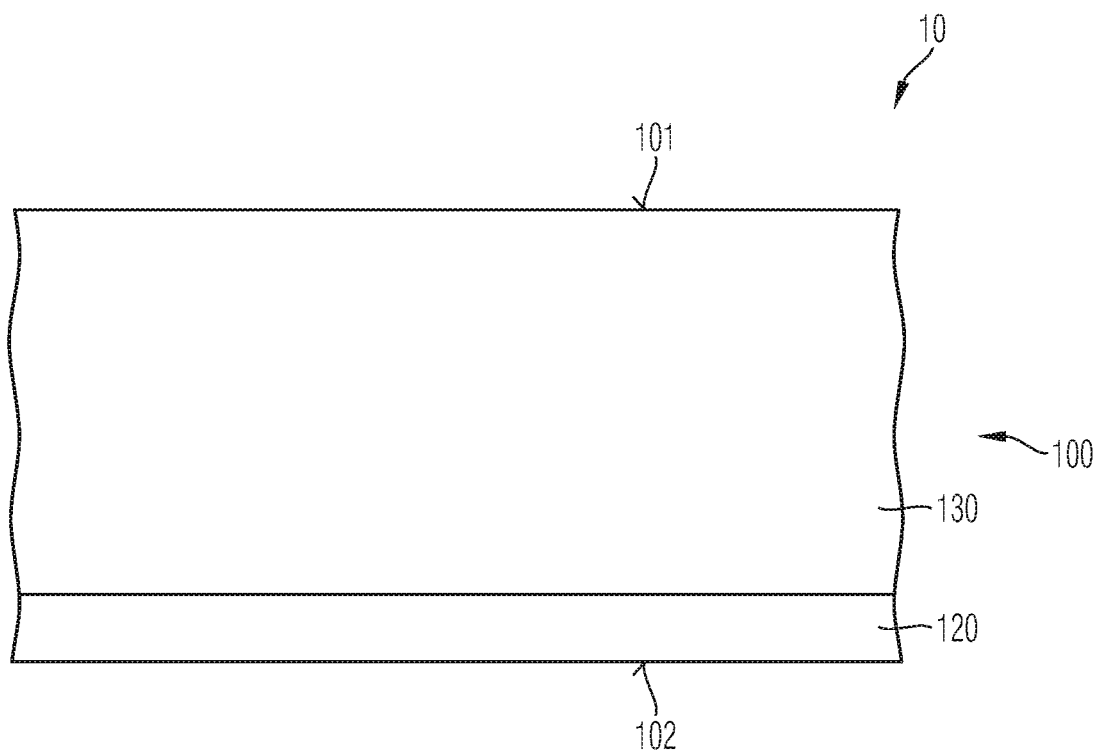

SEMICONDUCTOR DEVICE COMPRISING A TRENCH STRUCTURE

BACKGROUND

A key component in semiconductor applications is a solid-state switch. As an example, switches turn loads of automotive applications or industrial applications on and off. Solid-state switches typically include, for example, field effect transistors (FETs) such as metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

It is further beneficial to increase the thermoelectric safe operating area of an ESD structure to achieve a predetermined electrostatic discharge robustness while having at the same time a reduced area consumption of the ESD protection structure.

It is thus desirable to provide a semiconductor device structure with enhanced ESD protection and thermal characteristics, having at the same time an optimized area efficiency and less topology.

SUMMARY

The present disclosure relates to a semiconductor device comprising a trench structure. The trench structure extends into a semiconductor body from a first surface. The trench structure comprises a shield electrode, a dielectric structure, and a diode structure. The diode structure is arranged at least partly between the first surface and a first part of the dielectric structure. The shield electrode is arranged between the first part of the dielectric structure and a bottom of the trench structure.

The present disclosure further relates to a method for manufacturing a semiconductor device. The method comprises forming a trench structure extending into a semiconductor body from a first surface, and forming, in the trench structure, a shield electrode, a dielectric structure, and a diode structure. The diode structure is arranged at least partly between the first surface and a first part of the dielectric structure. The shield electrode is arranged between the first part of the dielectric structure and a bottom of the trench structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1 is a schematic cross-sectional view of a portion of a semiconductor device in accordance with an embodiment.

FIG. 6 illustrates a schematic process chart of a method of manufacturing a semiconductor device in accordance with an embodiment.

FIGS. 7A to 7G are cross-sectional views illustrating a method of manufacturing a semiconductor device in accordance with an embodiment.

DETAILED DESCRIPTION

Figure 2A:
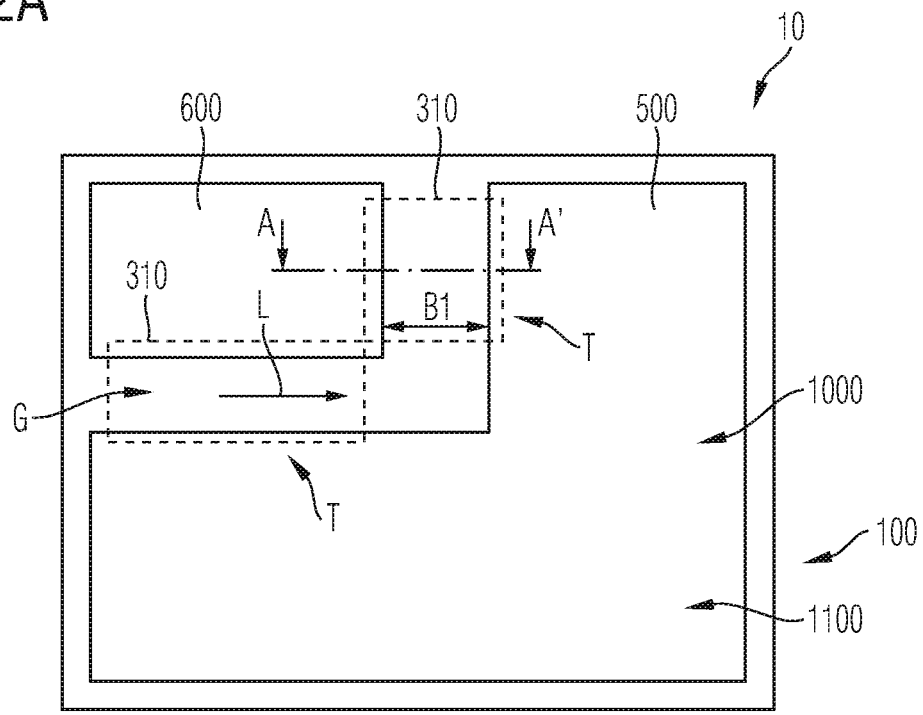
FIGS. 2A and 2B are schematic plan views of a portion of a semiconductor device in accordance with different embodiments.

In the following detailed description, reference is made to the accompanying drawings, which form a part hereof, and in which are shown by way of illustrations specific embodiments. It is to be understood that other embodiments may be utilized, and structural and logical changes may be made without departing from the scope of the embodiments. For example, features illustrated or described for one embodiment may be used on or in conjunction with other embodiments to yield yet a further embodiment. It is intended that the embodiments include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices may be formed with opposite doping relations so that the first conductivity type may be p-doped and the second conductivity type may be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region.

Indicating the relative doping concentration does not, however, mean that doping regions of the same relative doping concentration have the same absolute doping concentration unless otherwise stated. For example, two different $n^+$ regions may have different absolute doping concentrations. The same applies, for example, to an $n^+$ and a $p^+$ region.

The first conductivity type may be n- or p-type provided that the second conductivity type is complementary.

The term, "electrically connected" describes a permanent low-ohmic connection between electrically connected elements, for example a direct contact between the concerned elements or a low-ohmic connection via a metal and/or highly doped semiconductor.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "lateral" as used in this specification intends to describe an orientation substantially parallel to a first or main surface of a semiconductor substrate or body. This may be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Al, Sn, Au, Ag, Pt, Pd, and an alloy of one or more of these metals may be used as the material. The electrode metal layer (s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole such as, for example, laminating techniques as well as techniques in which layers are deposited in a sequential manner such as, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above-mentioned techniques, and pull the tape, e.g., along four orthogonal directions in the plane of the tape. By pulling the tape, the semiconductor wafer gets divided into a plurality of semiconductor dies (chips).

It is to be understood that the features of the various embodiments described herein may be combined with each other, unless specifically noted otherwise.

FIG. 1 is a schematic cross-sectional view of a portion of a semiconductor device 10 in accordance with an embodiment. The semiconductor device 10 comprises a trench structure T, which extends into a semiconductor body 100 from a first surface 101. The trench structure T comprises a shield electrode 330, a dielectric structure 200, and a diode structure 310. The diode structure 310 is arranged at least partly between the first surface 101 and a first part 210 of the dielectric structure 200. The shield electrode 330 is arranged between the first part 210 of the dielectric structure 200 and a bottom of the trench structure T.

By providing the diode structure 310 accommodated in the trench structure T, wherein the shield electrode 330 is arranged between the bottom of the trench structure T and the diode structure 310, a semiconductor device having less surface topology may be provided, wherein the diode structure 310 may further be electrically shielded from the semiconductor body 100 of the semiconductor device 10 via the shield electrode 330. Furthermore, a lower thermal impedance of the diode structure 310 is achieved due to the arrangement of the diode structure 310 within the trench structure T without being arranged on a field dielectric layer on the first surface 101 of the semiconductor body 100. The diode structure 310 may be an electrostatic discharge protection structure. The diode structure 310 may be, in this case, a back-to-back diode chain constituting the electrostatic discharge protection structure. The diode structure 310 will be described in the following as an electrostatic discharge protection structure, being an embodiment of the diode structure 310. However, the diode structure 310 shall not be understood as being restricted to an electrostatic discharge protection structure. As can be seen from FIG. 3C, the diode structure 310 may be also a single diode, acting, for example, as a temperature sensor.

Figure 2B:
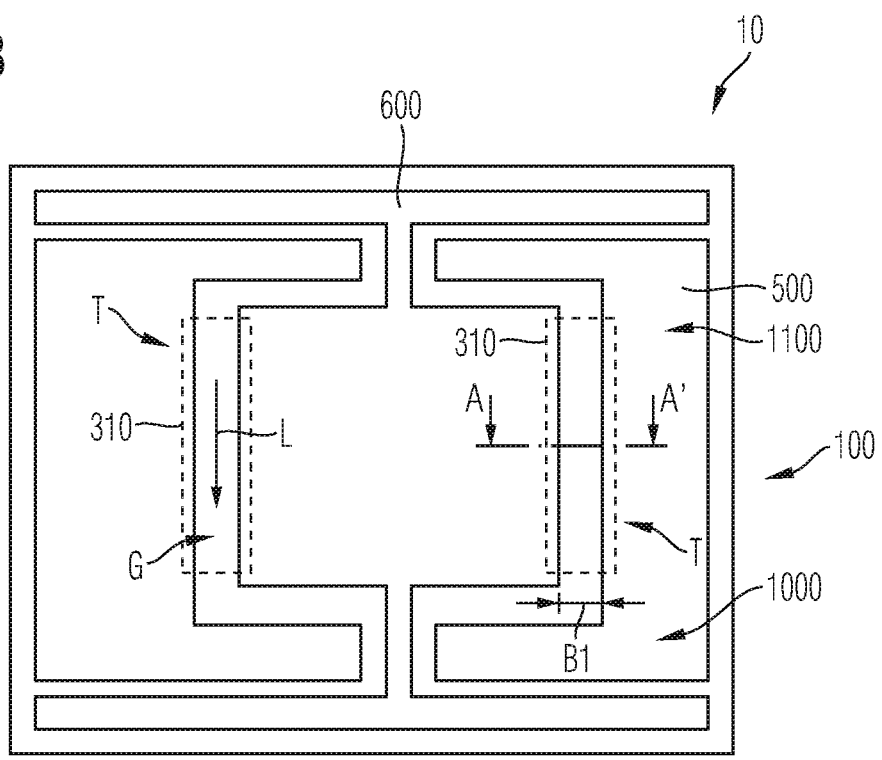

FIGS. 2A and 2B are schematic plan views of portions of a semiconductor device 10 comprising a transistor structure 1000 in accordance with different embodiments.

As depicted in FIG. 2A, a gate contact structure 600 of the transistor structure 1000 is in a corner portion of the semiconductor device 10 and may act as a gate pad. The gate pad may be used for providing a bonding or soldering contact to be connected to an external device or element. A source contact structure 500 of the transistor structure 1000 is arranged next to the gate contact structure 600 and may act as a source pad, The source pad may also be used for providing a bonding or a soldering contact to an external device or element.

When forming the semiconductor device 10 as a power semiconductor element, a resulting thickness of the metallization of the source contact structure 500 and the gate contact structure 600 may be in a range from 1 µm to 10 µm, or from 3 µm to 7 µm, and the source contact structure 500 and the gate contact structure 600 may be laterally separated by a minimum distance B1 in a range from 5 µm to 20 µm, or from 10 µm to 15 µm. When applying anisotropic etching processes, the distance may be set in the range from 2 µm to 5 µm, for example. As can be seen from FIG. 2B, the gate contact structure 600 may be also arranged in a middle part of the semiconductor device 10, wherein the source contact structure 500 surrounds the gate contact structure 600. Possible locations of the trench structure T and the respective diode structure 310 as well as the shield electrode 330 accommodated in the trench structure T are indicated by dashed lines, wherein the indicated places are only exemplary and should not be understood as limiting.

In the plan views of FIGS. 2A and 2B, a lateral gap G extends between an edge portion of the source contact structure 500 and an edge portion of the gate contact structure 600. The normal to the first and second surfaces 101, 102 defines a vertical direction and directions orthogonal to the normal direction are lateral directions within a lateral plane. The lateral gap G may be a longitudinal gap extending along a length direction L, wherein the length direction L of the lateral gap G is to be understood as a direction parallel to a straight line, which does not cross parts of the source contact structure 500 and/or the gate contact structure 600 in a lateral plane. In other words, the lateral gap G has a larger extension in a lateral plane parallel to edge portions of the source contact structure 500 and the gate contact structure 600 in comparison to its extension along a direction orthogonal to or facing the edge portions of the source contact structure 500 and the gate contact structure 600. It is to be noted that the length direction L depends upon the location within the lateral gap G and has not to be understood as a single direction.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs), and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a gate terminal.

Figure 3A:
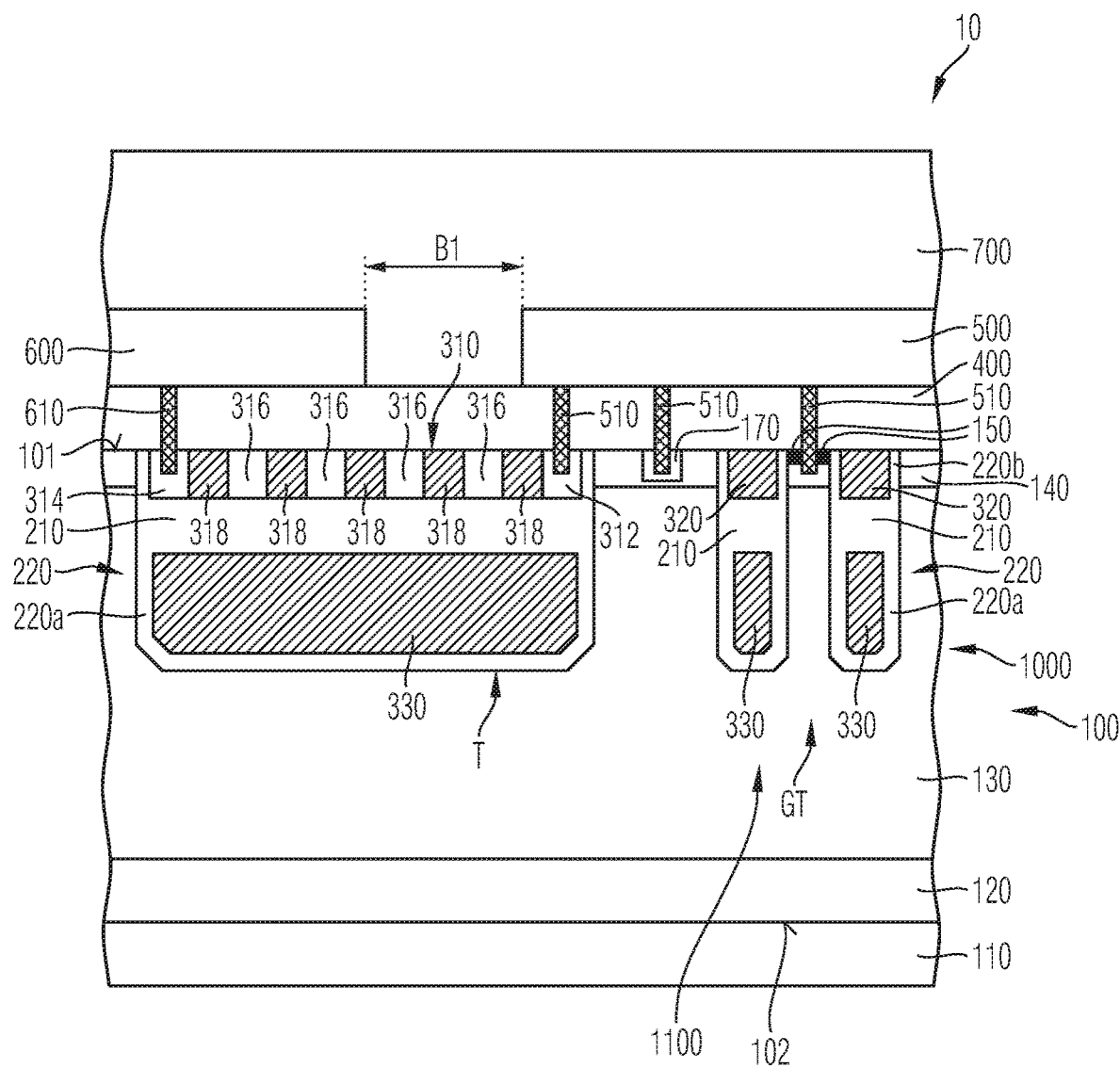
FIG. 3A is a schematic cross-sectional view of a portion of a semiconductor device taken along a section plane A-A' of FIG. 2A or FIG. 2B in accordance with an embodiment.

FIG. 3A is a schematic cross-sectional view of a portion of a semiconductor device 10 taken along a section plane A-A' of FIG. 2A or FIG. 2B in accordance with an embodiment.

The semiconductor body 100 may be provided from a single-crystalline semiconductor material, for example silicon Si, silicon carbide SiC, germanium Ge, a silicon germanium crystal SiGe, gallium nitride GaN or gallium, arsenide GaAs. A distance between the first and second surfaces 101, 102 is selected to achieve a specified voltage blocking capability and may be at least 2 µm, or may be at least 5 µm, or may be at least 20 µm, or may be at least 50 µm, for example. Other embodiments may provide a semiconductor body 100 with a thickness of several 100 µm. The semiconductor body 100 may have a rectangular shape with an edge length in the range from 500 µm to several millimeters. Referring to FIG. 3A, the trench structure T extends into the semiconductor body 100 from the first surface 101. The trench structure T comprises the shield electrode 330, the dielectric structure 200, and the diode structure 310. The diode structure 310 is arranged between the first surface 101 and the first part 210 of the dielectric structure 200. The shield electrode 330 is arranged between the first part 210 of the dielectric structure 200 and a bottom of the trench structure T. The dielectric structure 200 may further comprise a second part 220, which lines an inner surface of the trench structure T. Thus, the trench structure T comprises a stacked structure of the shield electrode 330, the first part 210 of the dielectric structure 200, and the diode structure 310, arranged sequentially along a vertical direction from the bottom to the top side of the trench structure T. The stacked layer structure of the shield electrode 330, the first part 210 of the dielectric structure 200, and the diode structure 310 is further embedded within the second part 220 of the dielectric structure 200, which lines the inner surface or the inner walls of the trench structure T, and which is further on the top side of the diode structure 310. Thus, the shield electrode 330 and the diode structure 310 are embedded within the dielectric structure 200, wherein the first part 210 of the dielectric structure 200 is between the shield electrode 330 and the diode structure 310 to electrically isolate the shield electrode 330 from the diode structure 310. The shield electrode 330 may comprise a polycrystalline silicon material. A net dopant concentration of the shield electrode 330 may be higher than $1\times10^{19}$ cm$^{-3}$, for example.

The diode structure 310 may comprise a first terminal region 312 and a second terminal region 314 to be electrically connected to the source contact structure 500 and the gate contact structure 600, respectively. The first terminal region 312 and the second terminal region 314 may be of a first conductivity type, such as an n-type, for example. The diode structure 310 may comprise a polycrystalline silicon layer 300 having first regions 316 and at least one second region 318 of opposite conductivity type alternatively arranged to constitute a back-to-back diode chain. Thus, the diode structure 310 may include at least one polysilicon diode having the first and second regions 316, 318 connected in series. Herein, the resulting diode may be bidirectional, having an odd number of first and second regions 316, 318, e.g. a n-p-n- . . . -p-n structure. The resulting diode may also be unsymmetrical, having an even number of first and second regions 316, 318, e.g. a n-p-n- . . . -p structure.

In one or more embodiments, the diode structure 310 may be manufactured by forming a polycrystalline silicon layer of a first conductivity type within the trench structure T, as will be described below. After forming the polycrystalline silicon layer, a mask layer (not shown), e.g. a hard mask layer or a resist layer is formed on the polycrystalline silicon layer and is patterned by a lithographic process, such that the second regions 318 are not covered by the mask layer. In a subsequent implantation process, dopants of a second conductivity type are introduced into the exposed second regions 318 not covered by the mask layer on the polycrystalline silicon layer, to form the second regions 318 of the second conductivity type. Thus, each of the first regions 316 and second regions 318 comprises first dopants of the first conductivity type, and the second regions 318 further comprise second dopants of the second conductivity type overcompensating the first dopants of the first conductivity type.

In another embodiment, each of the first regions 316 may comprise first dopants of the first conductivity type and the second regions 318 may comprise second dopants of the second conductivity type only, without overcompensating the first dopants of the first conductivity type. Herein, the first dopants are introduced into the first regions 316 and the second dopants are introduced into the second regions 318, respectively, in a separate process, e.g. by ion implantation and/or diffusion, wherein overlapping regions between the first and second regions 316, 318 may comprise first and second dopants due to diffusion of the dopants.

As a result, a polysilicon diode chain or string arranged in a lateral direction having alternating pn-junctions (diodes) at the region boundaries of the first and second regions 316, 318 in the polycrystalline silicon layer 300 is formed. In an embodiment, the doping concentrations of the first and second regions 316, 318 are configured such that a series connections of Zener diodes are formed within the polycrystalline silicon layer. By the number of consecutive diodes each including a first region 316 and a second region 318, the breakdown voltage of the diode structure 310 may be adjusted. The diode structure 310 may thus comprise a polycrystalline silicon layer 300 having first regions 316 and at least one second 318 of opposite conductivity type alternatively arranged to constitute a back to back-diode chain. The diode structure 310 may be arranged along a direction being parallel to the first surface 101. Thus, the first terminal region 312 and the second terminal region 314 are arranged at a same depth within the trench structure T, wherein the first and second regions 316, 318 are alternatively arranged to constitute a back-to-back diode chain along a lateral direction being parallel to the first surface 101.

As will be discussed with regard to the method of manufacturing the semiconductor device 10 below, the trench structure T is filled, after having formed the shield electrode 330 and the first part 210 of the dielectric structure 200, with polycrystalline silicon, wherein the polycrystalline silicon has a planar top side being flush with the first surface 101 of the semiconductor body 100. Thus, the further structure of the semiconductor device 10 on the first surface 101 may be formed on a planar surface, thus significantly reducing the topology of the semiconductor device 10.

In order to electrically insulate the diode structure 310 and the shield electrode 330 in the trench structure T from the semiconductor body 100, the second part 220 of the dielectric structure 200 is formed to line a sidewall of the trench structure T. The second part 220 of the dielectric structure 200 may include one or any combination of an oxide, nitride and oxynitride, high-k material, an imide, an insulating resin or glass, for example. The second part 220 of the dielectric structure 200 may include a field oxide or gate oxide formed e.g. by thermal oxidation or deposition.

The second part 220 of the dielectric structure 200 may comprise a field dielectric layer 220a being, for example, a field oxide layer, which lines an inner surface of the trench structure T and which abuts the shield electrode 330. The second part 220 of the dielectric structure 200 may further comprise a gate dielectric layer 220b being, for example, a gate oxide layer, which lines an inner surface of the trench structure T and which abuts the diode structure 310 or a gate electrode 320.

The thickness of the field dielectric layer 220a of the second part 220 of the dielectric structure 200 may be in a range between 50 nm to 2000 nm, or in range between 50 nm to 1000 nm. The thickness of the gate dielectric layer 220b of the second part 220 of the dielectric structure 200 may be in a range of typical gate oxide thicknesses of trench metal oxide semiconductor (MOS) devices. Thus, the thickness of the gate dielectric layer 220b of the second part 220 of the dielectric structure 200 may be in a range between 5 nm to 200 nm, or in a range between 40 nm to 120 nm, or in a range between 60 nm to 100 nm. The thickness of the first part 210 of the dielectric structure 200 isolator 210 may be in a range between 50 nm to 2000 nm, or in range between 50 nm to 1000 nm.

The diode structure 310 is further covered on its planar-top side being flush with the first surface 101 of the semiconductor body 100 by an isolation layer 400 formed on the first surface 101 of the semiconductor body 100. The isolation layer 400 may be a single dielectric layer or may comprise a stack of dielectric layers. Herein, a first dielectric layer of the isolation layer 400 may include a tetraethylorthosilicate (TEOS)/undoped silicate glass (USG) film. The thickness of the first dielectric layer of the isolation layer 400 may be in a range from 50 nm to 500 nm. A second dielectric layer of the isolation layer 400 may include a phosphosilicate glass (PSG) or a borophosphosilicate glass (BPSG). The thickness of the second dielectric layer of the isolation layer 400 may be in a range from 200 nm to 2 µm.

The source contact structure 500 may be formed on the isolation layer 400. The gate contact structure 600 may be formed on the isolation layer 400, which is spaced apart from a part of the source contact structure 500 by the lateral gap. On the source contact structure 500 and the gate contact structure 600, a further passivation layer 700 may be formed, which may include one or any combination of an imide, a nitride, an oxide or an oxynitride, for example.

Referring to FIG. 3A, the source contact structure 500 may be electrically coupled to the first terminal region 312 of the diode structure 310 via a first electric contact structure 510, wherein the gate contact structure 600 may be electrically coupled to the second terminal region 314 of the diode structure 310 via a second contact structure 610. The first and second electric contact structures 510 and 610 may be extended along a vertical direction through the isolation layer 400. As can be further seen from FIG. 3A, the first electric contact structure 510 may be provided to interconnect the source contact structure 500 with the source regions 150 of the transistor structure 1000.

The first and second electric contact structures 510, 610 are depicted in FIG. 3A as vias extending through the isolation layer 400 along a vertical direction, wherein the dimension along the vertical direction may be larger than the dimension along a lateral direction. In such a case, the first and second electric contact structures 510, 610 may be formed separately to the source contact structure 500 and the gate contact structure 600. In case the isolation layer 400 has a dimension along the vertical direction being comparable to that of the openings for contacting the source contact structure 500 and the gate contact structure 600 with the structures in the semiconductor body 100, the first and second electric contact structure 510, 610 may also be formed simultaneously with the source contact structure 500 and the gate contact structure 600, respectively, to form a planar contact structure.

The gate contact structure 600 may comprise a metal. In addition, the source contact structure 500 may comprise a metal. The source contact structure 500 and the gate contact structure 600 may be patterned parts of a same conductive material layer of a same wiring level, e.g. of a single conductive material layer or of a single conductive material stack. The gate contact structure 600 and the source contact structure 500 may be separate parts, e.g. due to lithographic patterning, of a common metal wiring layer or stacked layer. The gate contact structure 600 and the source contact structure 500 may be formed as a metal layer structure including the first and second electric contact structures 510 and 610, respectively. Such a metal layer structure may include, as main constituent (s), aluminum Al, copper Cu or alloys of aluminum or copper, for example AlSi, AlCu, or AlSiCu. According to other embodiments, the gate contact structure 600 and the source contact structure 500 may include one, two, three or more sub-layers, each sub-layer including, as a main constituent, at least one of nickel Ni, titanium Ti, silver Ag, gold Au, tungsten W, platinum Pt and palladium Pd. For example, a sub-layer may contain a metal nitride or a metal alloy including Ni, Ti, Ag, Au, W, Pt, Pd and/or Co.

Referring to FIG. 3A, next to the diode structure 310 accommodated in the trench structure T, the transistor structure 1000 in the semiconductor body 100 is provided. Some of the features as described in the following may be specific features of an embodiment, in which the semiconductor body 100 is a silicon semiconductor body. However, the transistor structure 1000 and the embodiment as described with regard to FIG. 3A shall not be regarded as limiting, since some of the features may be provided in a different manner when providing a semiconductor body not being a silicon semiconductor body.

The transistor structure 1000 comprises transistor cells 1100 arranged in an overlapping area between the source contact structure 500 and the semiconductor body 100. For the sake of simplicity, only two transistor cells 1100 are shown. The transistor structure 1000 comprises a gate trench structure GT extending from the first surface 101 into the semiconductor body 100. The gate trench GT comprises the shield electrode 330, the dielectric structure 200, and a gate electrode 320 of the transistor structure 1000. The gate electrode 320 is arranged between the first surface 101 and the first part 210 of the dielectric structure 200. The shield electrode 330 is arranged between the first part 210 of the dielectric structure 200 and a bottom of the gate trench structure GT. The gate trench structure GT accommodates the gate electrode 320 of the transistor structure 1000 and the shield electrode 330.

The second part 220 of the dielectric structure 200 may line an inner surface of the gate trench structure GT constituting the gate dielectric of the transistor structure 1000. Thus, the gate trench structure GT comprises a stacked structure of the shield electrode 330, the first part 210 of the dielectric structure 200, and the gate electrode 320, arranged sequentially along a vertical direction from the bottom to the top side of the gate trench structure T. The stacked layer structure of the shield electrode 330, the first part 210 of the dielectric structure 200, and the gate electrode 320 is further embedded within the second part 220 of the dielectric structure 200, which lines the inner surface or the inner walls of the gate trench structure GT. Thus, the shield electrode 330 and the gate electrode 320 are embedded within the dielectric structure 200 and 400, wherein the first part 210 of the dielectric structure 200 is between the shield electrode 330 and the gate electrode 320 to electrically isolate the shield electrode 330 and the gate electrode 320 from each other. The gate electrode 320 may comprise a polycrystalline silicon material. A net dopant concentration of the gate electrode 320 may be larger than $1 \times 10^{19}$ cm$^{-3}$.

Due to the different electric characteristic of the gate electrode 320 and the diode structure 310, the net dopant concentration of polycrystalline silicon of the gate electrode 320 or the shield electrode 330 may be 10 times larger than the net dopant concentration of polycrystalline silicon of the first region 316 of the diode structure 310 in the trench structure T. Each of the transistor cells 1100 further comprise the source regions 150 being in contact with the first surface 101 of the semiconductor body 100 and extending into the semiconductor body 100, and body regions 140, in which the source regions 150 are embedded. The source regions 150 are of the first conductivity type and the body regions are of the second conductivity type.

Furthermore, a drain region 120 of the first conductivity type is at the second surface 102 of the semiconductor body 100. On the drain region 120, a drain contact structure 110 may be formed, which may be a metallization layer having comparable characteristics and properties as the source contact structure 500 or the gate contact structure 600.

The source contact structure 500 at the first surface 101 is electrically connected to the source regions 150 and to the first terminal region 312 of the diode structure 310. The gate contact structure 600 at the first surface 101 is electrically connected to the gate electrode 320 of the transistor structure 1000 and to the second terminal region 314 of the diode structure 310. The shield electrode 330 is electrically connected to the source regions 150 of the transistor structure 1000. The shield electrode 330 provides an electrical shielding of the diode structure 310 and the gate electrode 320 against electric potentials in the semiconductor body 100, for example a drain potential at the drain region 120 at the second surface 102 of the semiconductor body 100.

A drift region 130 is formed between the drain region 120 and the body regions 140 and is of a first conductivity type. In case of a super-junction device, semiconductor regions of the first conductivity type and of the second conductivity type may be alternatingly arranged along a lateral direction and interposed between the drain region 120 and the body regions 140. The semiconductor regions of the first conductivity type may act as drift regions and the semiconductor regions of the second conductivity type may act as charge compensation regions, for example.

Figure 3B:
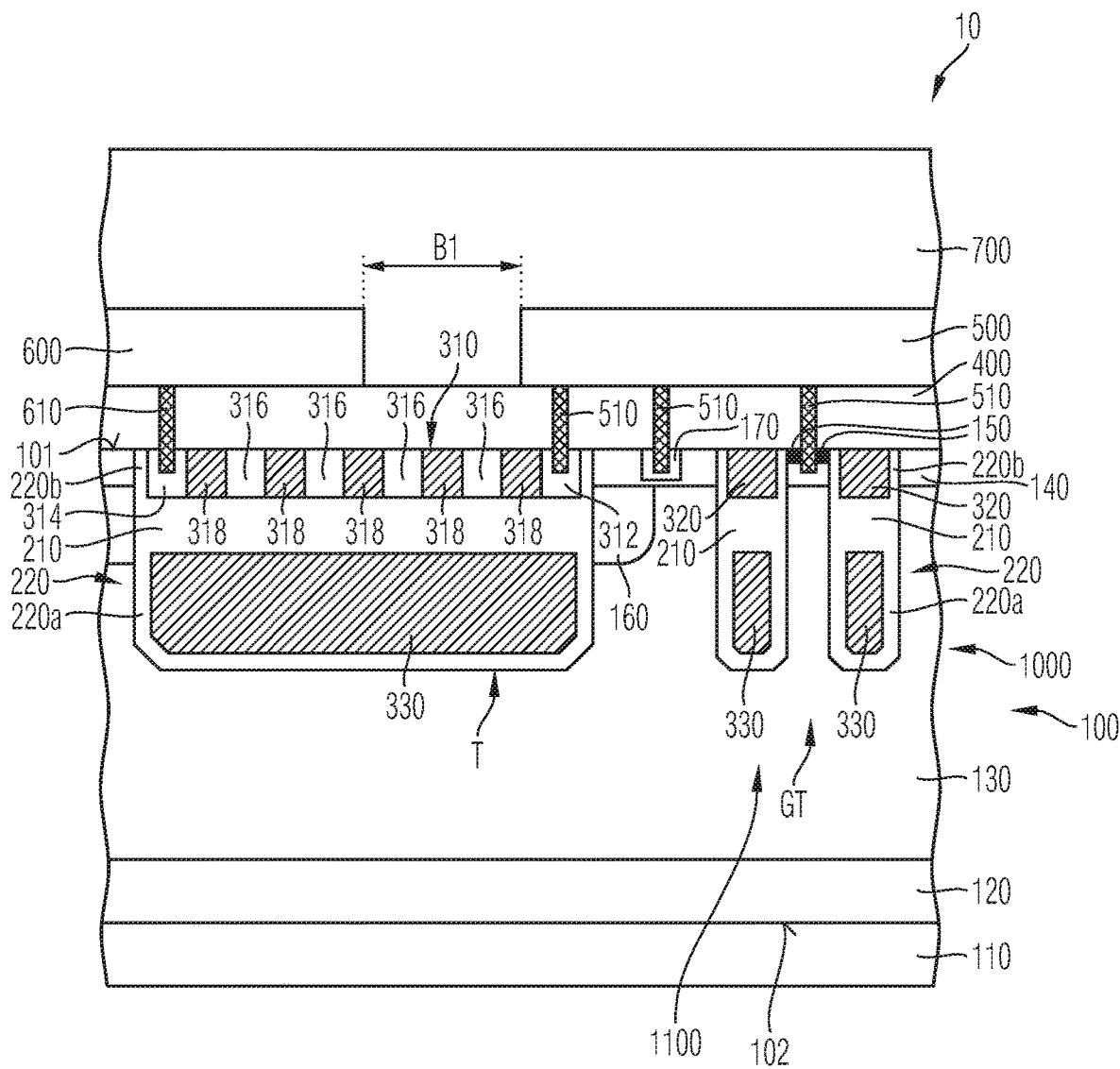
FIG. 3B is a schematic cross-sectional view of a portion of a semiconductor device taken along a section plane A-A' of FIG. 2A or FIG. 2B in accordance with an embodiment.

As can be further seen from the embodiment depicted in FIG. 3B, the trench structure T may be surrounded by a well region 160 in the semiconductor body 100 within a lateral plane. The well region 160 may be a well implantation of the second conductivity type. The well region 160 may be a junction termination extension region. In order to define the potential of the well region 160 to be equal to the source potential, the well region 160 is electrically coupled to the source contact structure 500 via the first electric contact structure 510. The well region 160 may extend into the semiconductor body 100 from the first surface 101.

The well region 160 may be used for the trench structure T accommodating the diode structure 310 for the reduction of the electrical field as a buried shielding of the second conductivity type. Herein, the diode structure 310 or the back to back-diode chain or back to back-Zener diode chain may be electrically isolated from the drain potential by both the dielectric isolation of the dielectric structure 200 (optionally constituting a gate oxide having a thickness in a range between 5 nm to 500 nm, or in a range between 20 nm to 500 nm, or in a range between 20 nm to 200 nm) and the junction isolation of the vertical pn-junction formed between the drift region 130 and the well region 160.

Thus, to improve electrical shielding, the diode structure 310 can be combined with a well region 160 of a second conductivity type, for example a p-type, connected to the field plate (source) potential of the shield electrode 330 which reaches deeper than the diode structure 310, thereby providing shielding from the side in addition to the field plate shielding from the bottom. An additional electrical shielding of the diode structure 310 by means of the body regions 140 of a second conductivity type, for example a p-type, and, optionally by the well region 160, which is of a p-type doping, can be achieved. The junction termination extension 160 may be part of a trench metal oxide semiconductor field effect transistor (MOSFET) or a trench insulated gate bipolar transistor (IGBT) edge termination structure. Thus, the well region 160 may reach deeper into the semiconductor body 100 than the diode structure 310 or the shield electrode 330. The diode structure 310 in the trench structure T and the well region 160 in the semiconductor body 100 may be overlapping each other along a vertical direction. The diode structure 310 in the trench structure T and the well region 160 in the semiconductor body 100 may also extend into the semiconductor body 100 along the vertical direction having a distance from the first surface 101 being higher than the extension of the diode structure 310 or the shield electrode 330 into the semiconductor body 100.

The diode structure 310 in the trench structure T and the well region 160 in the semiconductor body 100 may overlap each other along a vertical direction. The gate electrode 320 in the gate trench structure GT and the well region 160 in the semiconductor body 100 may overlap each other along a vertical direction. The shield electrode 330 in the trench structure T and the well region 160 in the semiconductor body 100 may overlap each other along a vertical direction. The well region 160 in the semiconductor body 100 may be electrically connected with the source contact structure 500 and the source regions 150 via the first electric contact structure 510. Thus, the well region 160 of a second conductivity type, such as a p-type, for example, is on the same potential as the body regions 140, the source regions 150 and the source contact structure 500. Due to the overlap along the vertical direction between the shield electrode 330 and the well region 160, the diode structure 310 is not only shielded by the shield electrode 330 against the drain potential of the drain region 120, but also shielded by the body regions 140 and the well region 160 at a side portion of the trench structure T accommodating the diode structure 310.

Thus, by providing the well region 160 additionally shielding the electrical field from the boundary surface at which the dielectric structure 200 is provided, the second part 220 of the dielectric structure 200 having a small thickness in a range between 5 nm to 200 nm, or in a range between 20 nm to 200 nm, may be formed lining the gate trench structure GT and the trench structure T, without providing a field dielectric layer in addition for shielding the trench structure T or the gate trench structure GT.

Referring to FIGS. 3A and 3B, the layer structure of the embodiment of the semiconductor device 10 shows significantly less surface topology due to the planar first surface 101 and a lower thermal impedance of the diode structure 310 due to the dielectric structure 200 being a thin gate dielectric layer having a thickness in a range between 5 nm to 200 nm, or in a range between 20 nm to 200 nm, or in a range between 40 nm to 100 nm, compared to polysilicon diodes on top of field oxides having a thickness in a range between 1 μm to 5 μm, or in a range between 1 μm to 2 μm, for example. In contrast to known manufacturing processes for insulated gate bipolar transistors with planar cell topology, the electrostatic discharge (ESD) protection diode of the diode structure 310 may be integrated in the silicon drift layer of the drift region 130. This is achieved by the trench gate concept in combination with a buried p-shielding by means of a deep p-well of the well region 160. To get a sufficient planarization of the electrostatic discharge (ESD) protection diode polycrystalline silicon filled trenches of the diode structure 310, the width of each of the Zener diodes may be reduced to 0.5 μm up to 2 μm. Referring to the cross-sectional view of FIG. 3A, a high voltage silicon vertical power MOSFET with a monolithically integrated polysilicon back-to-back electrostatic discharge (ESD) protection diode cascade for gate/source electrostatic discharge (ESD) human body model (HBM) protection is provided.

Figure 3C:
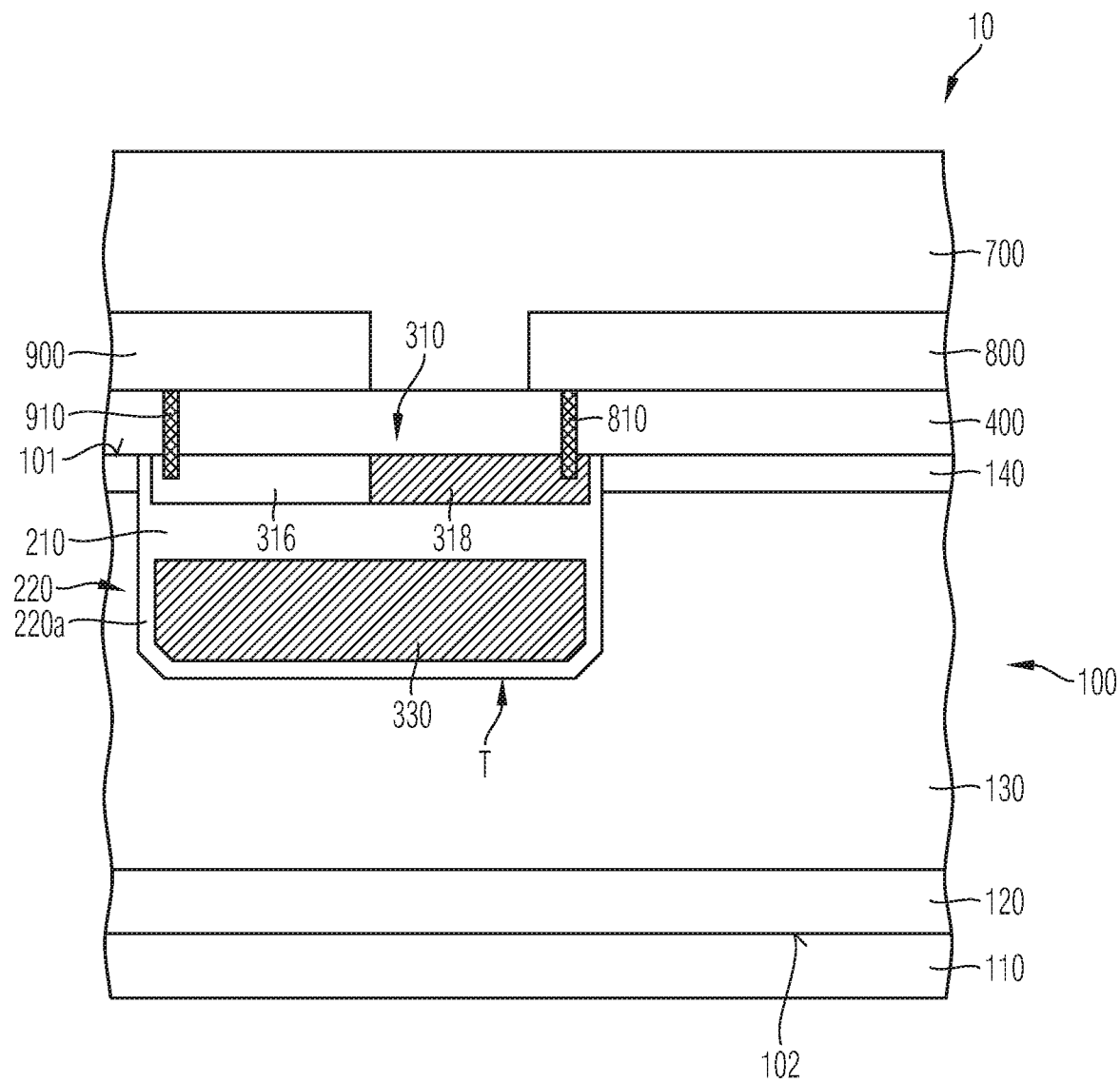
FIG. 3C is a schematic cross-sectional view of a portion of a semiconductor device in accordance with another embodiment.

FIG. 3C is a schematic cross-sectional view of a portion of a semiconductor device in accordance with another embodiment.

The diode structure 10 may also be, according to an embodiment, instead of an electrostatic discharge protection structure, a single diode to provide a sensing signal. The diode structure 310 may act, for example, as a temperature sensor. Instead of a diode structure 310, also an integrated polysilicon resistor may be provided. The doping concentration of the diode structure 310 may be in a range between $1\times10^{13}$ cm$^{-3}$ to $1\times10^{20}$ cm$^{-3}$, or in a range between $1\times10^{14}$ cm$^{-3}$ to $1\times10^{16}$ cm$^{-3}$. As can be seen from FIG. 3C, the single diode of the diode structure 310 comprises a first region 316 and a second region 318, which are comparable to the first region 316 and the second region 318 as discussed above. However, depending on the purpose of the single diode, the net dopant concentrations of the first region 316 and the second region 318 may vary in comparison to the usage within an electrostatic discharge protection structure. The single diode is contacted to a first wiring structure 800 and a second wiring structure 900 by means of a third electric contact structure 810 and a fourth electric contact structure 910, respectively. The first and second wiring structure 800, 900 may have the same structure and composition as the source contact structure 500 and the gate contact structure 600. The first and second wiring structure 800, 900 may also be provided as an intermediate wiring layer in a multilayer metallization structure. The third and fourth electric contact structure may have the same structure and composition as the first and second electric contact structure 510, 610.

Especially in the case of lower doping concentrations, an effective electrical shielding is needed to prevent sidewall or back-gate effects which can influence a depletion, enhancement or inversion region within the diode structure 310. Therefore, these diode structures 310 should be electrically shielded against static or ever-changing electric potentials within the ambience of the structure 310 within the semiconductor body 100. This electrical shielding can be provided by the dielectric structure 200 together with the shield electrode 330 and the well region 160 (FIG. 3B). Although not shown in FIG. 3C, also a further well region 160 may be provided as shown in FIG. 3B.

Figure 4:
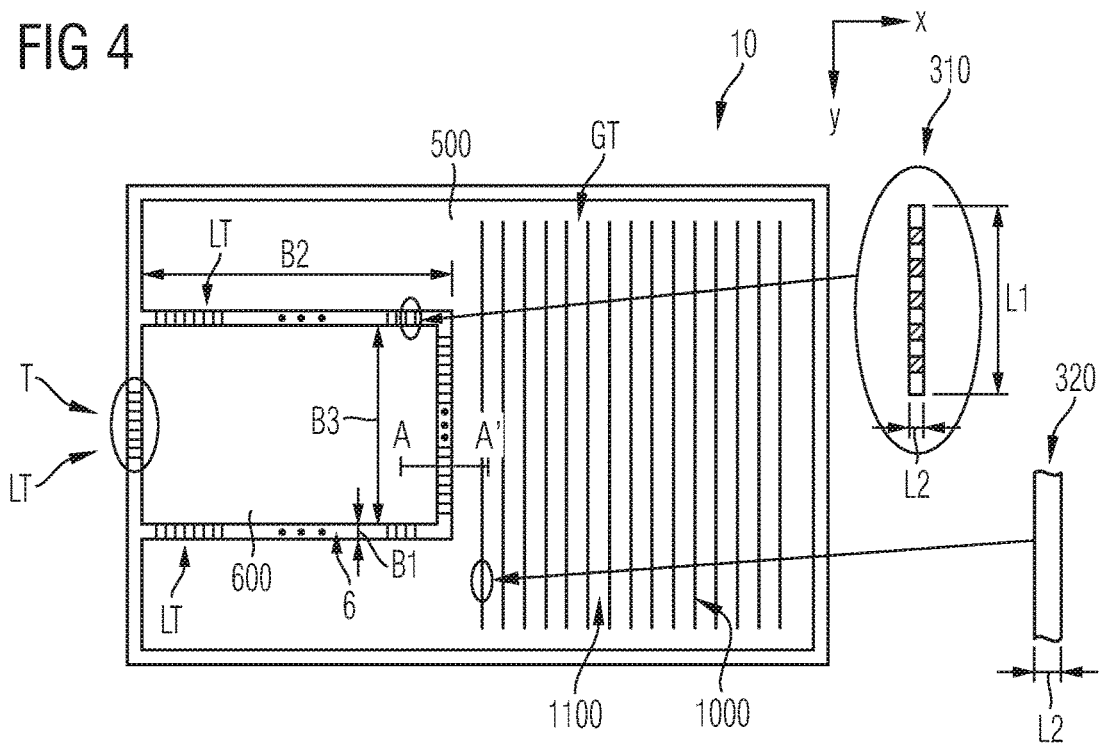
FIG. 4 is a plan view of a portion of a semiconductor device in accordance with an embodiment.
Figure 5:
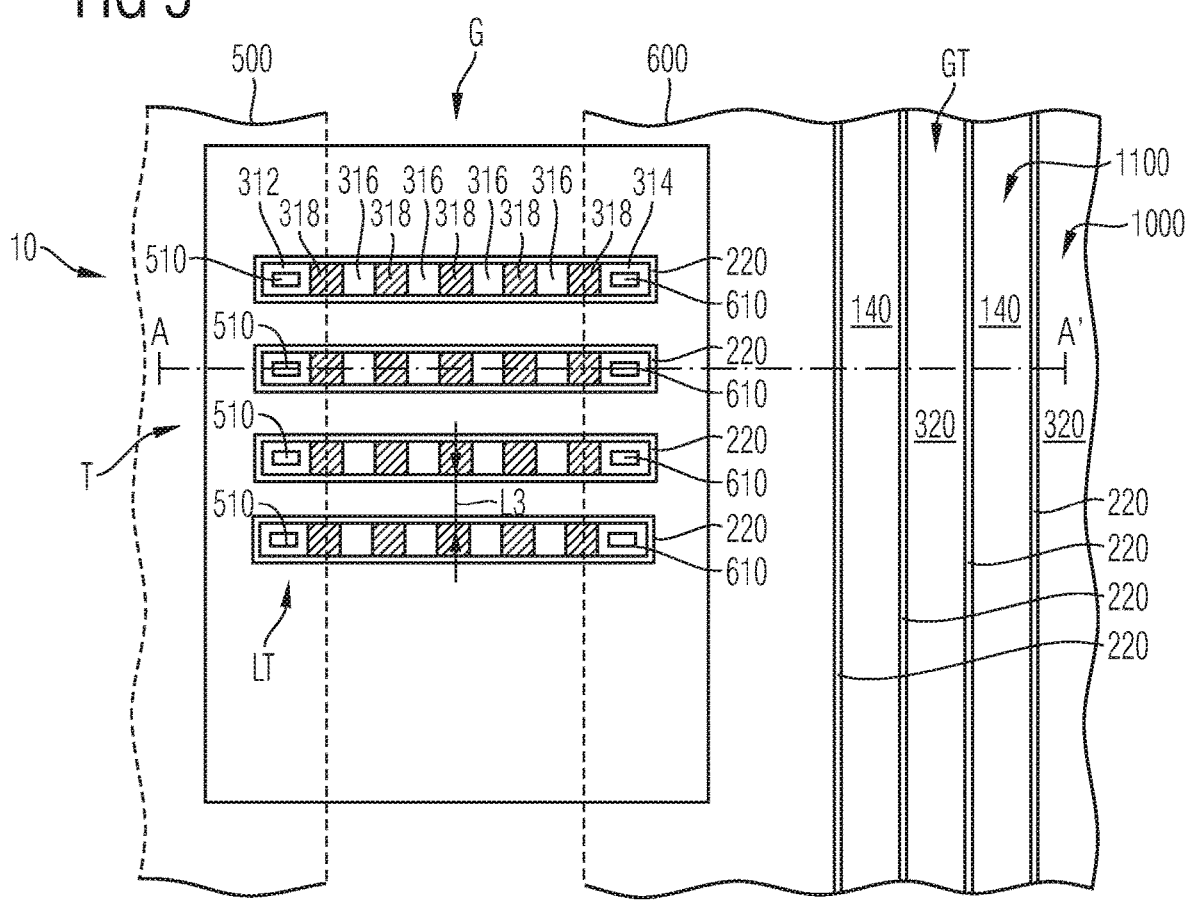
FIG. 5 is a detailed plan view of a portion of a semiconductor device of FIG. 4.

FIG. 4 is a plan view of a portion of the semiconductor device 10 according to an embodiment, wherein FIG. 5 is a detailed plan view of a portion of the semiconductor device 10 of FIG. 4.

As discussed above, the trench structure T is filled with polycrystalline silicon, wherein the polycrystalline silicon has a planar top side being flushed with the first surface 101 of the semiconductor body 100. As will be described below with regard to the method of manufacturing the semiconductor device 10, such a structure of the diode structure 310 being flush with the first surface 101 may be achieved by using a chemical mechanical polishing (CMP) process before depositing the isolation layer 400. Instead of a chemical mechanical polishing process, also a plasma etching process may be performed. In order to avoid bays, depressions or notches due to a too large polishing area of the polycrystalline silicon within the trench structure T, a mesa structure of the trench structure T depicted in FIG. 4 and depicted in more detail in FIG. 5 is provided. Herein, the trench structure T comprises a plurality of longitudinal trenches LT each accommodating a back to back-diode chain. Referring to FIG. 4 and FIG. 5, the longitudinal trenches LT each bridge the lateral gap G, wherein the source contact structure 500 and the gate contact structure 600 are formed within a same interconnection layer and are spaced from one another by the lateral gap G. The longitudinal trenches LT each have a length L1 along a longitudinal direction of the longitudinal trenches LT within a lateral plane being in a range between 2 µm to 100 µm, or between 5 µm to 50 µm, or between 10 µm to 30 µm. The longitudinal trenches LT further each have a width L2 being perpendicular to a longitudinal direction of the longitudinal trenches LT within a lateral plane being in a range between 100 nm to 10 µm, or between 200 nm to 5 µm, or between 500 nm to 2 µm. The longitudinal trenches LT may be arranged in parallel within a lateral plane having a mean distance L3 from each other in a range between 100 nm to 10 µm, or between 200 nm to 5 µm, or between 500 nm to 2 µm. The longitudinal trenches LT may be arranged in a regular pattern of longitudinal trenches LT each having the same distance L3 from one to another.

The longitudinal trenches LT may each have a length L1 along a longitudinal direction of the longitudinal trenches LT within a lateral plane and each have a width L2 perpendicular to a longitudinal direction of the longitudinal trenches LT within a lateral plane, wherein the ratio between the length L1 and the width L2 may be in a range between 5 to 100, or between 5 to 50, or between 2 to 50, or between 5 to 20.

The longitudinal trenches LT may be arranged in parallel having a mean distance L3 from each other and each having a width L2 perpendicular to a longitudinal direction of the longitudinal trenches LT within a lateral plane, wherein the ratio between the mean distance L3 and the width L2 may be in a range between 0.1 to 10, or between 0.2 to 5, or between 0.5 to 2. According to an embodiment, the mean distance L3 may be the same as the width L2.

As can be further seen from FIG. 4, the dimension of the gate contact structure 600 in a first lateral direction x may be in a range between 100 µm to 1000 µm, or between 200 µm to 600 µm, or between 300 µm to 400 µm. Furthermore, the dimension B3 of the gate contact structure 600 in a second lateral direction y may be in a range between 100 µm to 1000 µm, or between 200 µm to 600 µm, or between 250 µm to 350 µm. An exemplary length L1 of a longitudinal trench LT may be 20 µm, for example. Taking, for example, a width L2 of a longitudinal trench LT and a mean distance L3 of 1 µm, which leads to a pitch of 2 µm, the total number of back-to-back diode chains accommodated in the longitudinal trenches LT illustrated as lines in FIG. 4 bridging the lateral gap G between the source contact structure 500 and the gate contact structure 600 may be in a range between 300 to 700, or between 400 to 600, or between 450 to 500.

Thus, the total width of the diode chains within the longitudinal trenches LT may be up to 500 µm or up to 700 µm or up to 1000 µm. Thus, with reference to the layout principle of the embodiment depicted in FIG. 4 and FIG. 5, the breakdown voltage of the back-to-back electrostatic discharge (ESD) protection diode cascades may be set smaller than the gate oxide (GOX) tunnelling threshold voltage in view of desired gate oxide reliability. To meet electrostatic discharge (ESD) human body model (HBM) protection at the diode breakdown voltage VBS=k*VDB0 (k=number of electrical blocking pn junctions within the Z diode chain, VDB0=electrical breakdown voltage of each blocking pn junction), the ESD diode may have a low differential resistance in the breakdown mode. The top view of the monolithically integrated Zener diode of FIG. 4 shows a matrix of back-to-back diode chains with a cumulative width of 500 µm, which may allow for an electrostatic discharge-human body model (ESD-HBM) capability of more than 1 kV, for example.

Referring to FIG. 5, the longitudinal trenches LT for the polysilicon diodes have cross-sections such as the gate trench structure GT of the transistor structure 1000 which results in a small width for each diode. In each of the longitudinal trenches LT there is a pn-polycrystalline silicon diode chain. The ends of polycrystalline silicon diode chains are electrically connected in parallel to ensure a sufficient total cross section area for the electrostatic discharge current. The ends of polycrystalline silicon diode chains are connected to gate and source terminals by means of the second terminal region 314 and the first terminal region 312, respectively.

Referring to FIG. 4, according to an example, the longitudinal trenches LT with each 1 µm width, 1 µm spacing and 25 µm length are provided for good planarization. Referring to the plan view of FIG. 4, a monolithically integrated electrostatic discharge (ESD) protection diode matrix with the cumulative width of 500 µm is provided, which may allow for an electrostatic discharge (ESD)-human body model (HBM) capability of more than 1 kV, for example. The trench width for the gate trench structure GT and the longitudinal trenches LT are set similar. The width L2 is set smaller than 2 times the polycrystalline silicon deposition thickness, thereby allowing the longitudinal trenches LT to be filled completely during polycrystalline silicon deposition, and allowing for an unmasked polycrystalline silicon etch back without removing the polycrystalline silicon out of the gate trench structure GT. Although no multilevel metallization is shown, the diode structure described above may be also used in discrete or integrated circuits with multilayer metallization.

FIG. 6 is a schematic flow diagram for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate acts and/or phases.

A schematic flow diagram for illustrating a method 2000 of manufacturing a semiconductor device is depicted in FIG. 6.

Process feature S100 comprises forming a trench structure extending into a semiconductor body from a first surface.

Process feature S110 comprises forming, in the trench structure, a shield electrode, a dielectric structure, and a diode structure, wherein the diode structure is arranged between the first surface and a first part of the dielectric structure, and the shield electrode is arranged between the first part of the dielectric structure and a bottom of the trench structure.

In FIG. 7A to 7F, a method of manufacturing the semiconductor device 10 according to an embodiment will be described with reference to cross-sectional views for illustrating selected processes.

As can be seen from the method of manufacturing the semiconductor device 10 illustrated in FIGS. 7A to 7F, the trench structure T and the gate trench structure GT may be simultaneously formed to extend into the semiconductor body 100 from the first surface 101. Then, a second part 220 of the dielectric structure 200 is formed. Thereafter, after having formed the second part 220 of the dielectric structure 200 lining the trench structure T and the gate trench structure GT, polycrystalline silicon may be applied on the surface of the semiconductor body 100 until the trench structure T and the gate trench structure GT are filled. Then, the polycrystalline silicon may be removed to a predetermined trench depth, to form the shield electrode 330 in the trench structure T and the gate trench structure GT. Thereafter, the first part 210 of a dielectric structure 200 may be formed on the shield electrode 330 in the trench structure T and the gate trench structure GT. Then, polycrystalline silicon may be applied on the first part 210 of the dielectric structure 200 until the trench structure T and the gate trench structure GT are filled. Then, chemical mechanical polishing process may be carried out in order to remove polycrystalline silicon present above the trench structure T and the gate trench structure GT, such that the polycrystalline silicon in the gate trench structure GT and the polycrystalline silicon in the trench structure T are separated from one another. Instead of a chemical mechanical polishing process, also a plasma etching process may be performed.

Applying polycrystalline silicon on the first part 210 of the dielectric structure 200 may comprise filling the trench structure T with polycrystalline silicon having a first net dopant concentration and filling the gate trench structure GT with polycrystalline silicon having a second net dopant concentration being at least ten times higher than the first net dopant concentration.

In the following, the processes illustrated in FIGS. 7A to 7F will be described in more detail.

Referring to FIG. 7A, a semiconductor body comprising the drain region 120 and the drift region 130, as described above, is provided.

Figure 7B:
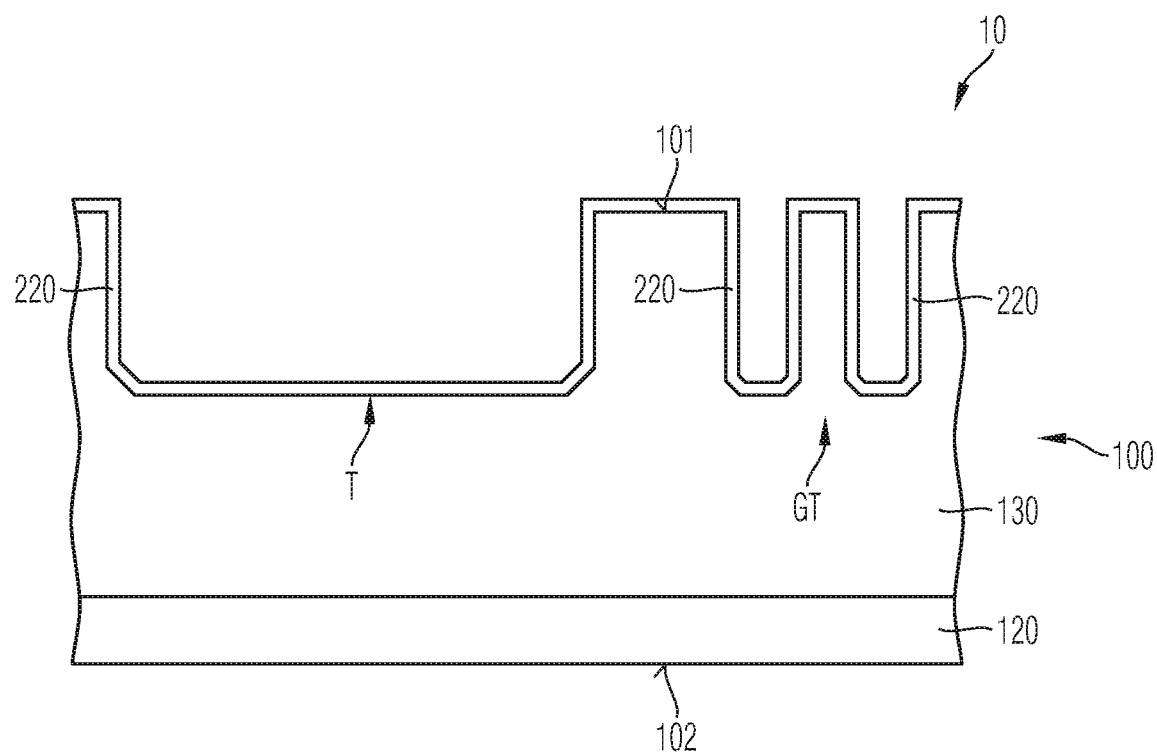

Referring to FIG. 7B, the trench structure T and the gate trench structure GT are formed simultaneously in the semiconductor body 100, to extend from the first surface 101 into the semiconductor body 100. The trench structure T and the gate trench structure GT may extend vertically up to a distance in a range between 0.5 μm to 10 μm, or in a range between 1 μm to 5 μm into the semiconductor body 100. The trench structure T and the gate trench structure GT may be formed by an appropriate process, e.g. by dry and/or wet etching. As an example, the trench structure T and the gate trench structure GT may be formed by an anisotropic plasma etch process, e.g. reactive ion etching (RIE) using an appropriate etch gas, e.g. at least one of $Cl_2$, $Br_2$, $CCl_4$, $CHCl_3$, $CHBr_3$, $BCl_3$, HBr. According to an embodiment, trench sidewalls of the trenches may be slightly tapered, e.g. including a taper angle between 80° to 90°. Slightly tapered trench sidewalls may be beneficial with regard to avoiding trench cavities when filling up trenches.

The trench structure T and the gate trench GT may be formed simultaneously in the semiconductor body 100, and may have a same depth along the vertical direction from the first surface 101 to the bottom of the respective trench structures T, GT. A dielectric layer constituting the second part 220 of the dielectric structure 200 is formed on the sidewalls of the trench structure T and the gate trench structure GT. The isolation layer may be formed by thermal oxidation and/or oxide deposition processes.

Figure 7C:
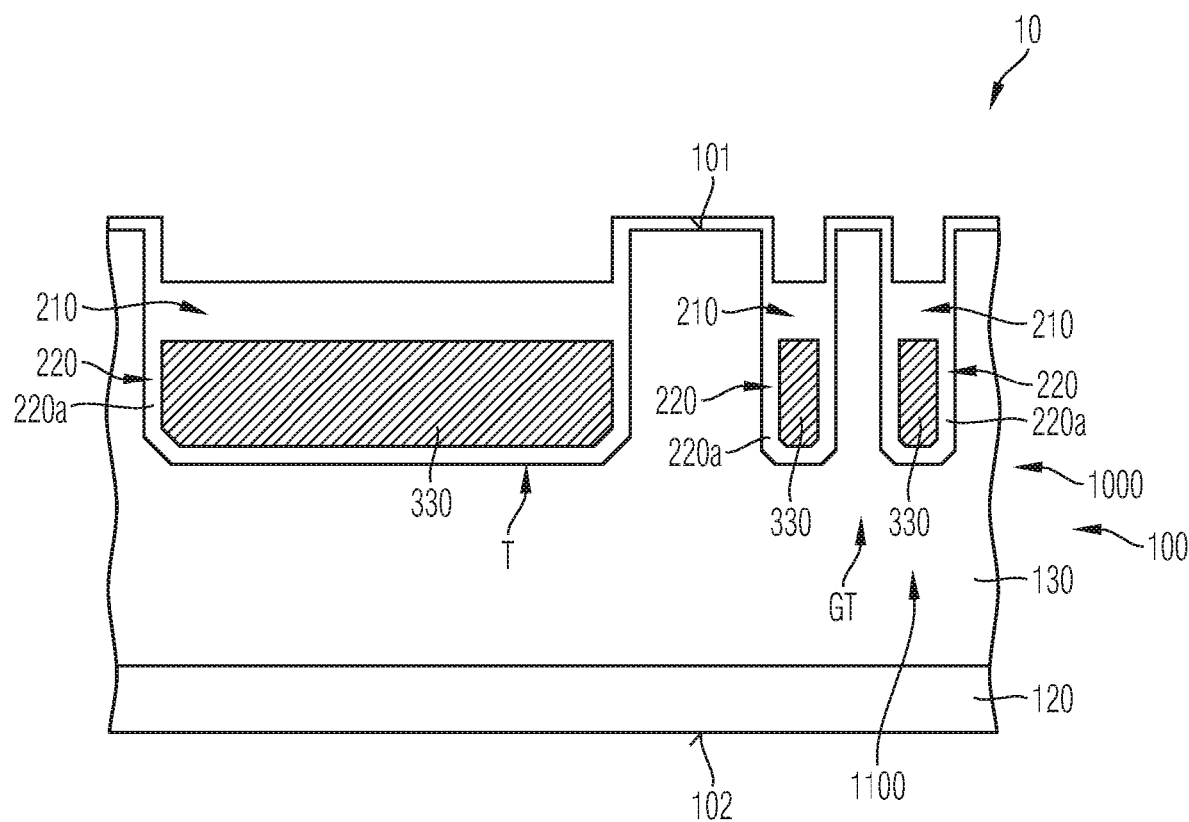

Referring to FIG. 7C, polycrystalline silicon is applied on the dielectric surface of the semiconductor body 100 until the trench structure T and the gate trench structure GT are filled. Thereafter, the polycrystalline silicon is removed to a predetermined trench depth, to form the shield electrode 330 in the trench structure T and the gate trench structure GT. Thus, the shield electrode 330 constituting a deep source polycrystalline silicon field plate structure is formed by depositing polycrystalline silicon within the trench structure T and the gate trench structure GT until the respective trench structures T, GT are filled. Thereafter, the polycrystalline silicon may be removed by a chemical mechanical polishing planarization process. Instead of a chemical mechanical polishing process, also a plasma etching process may be performed. Then, the polycrystalline silicon and parts of the second dielectric layer 220 is etched back to a predetermined trench depth, for example to half trench depth, to form the shield electrode 330. After forming the shield electrode 330, a dielectric layer constituting the first part 210 of the dielectric structure 200 is formed on the shield electrode 330 and the sidewall of the trench structure T and the gate trench structure GT. The deposited dielectric layer of the first part 210 of the dielectric structure 200, which may be an oxide, for example, may form a sacrificial oxide for the gate dielectric layer 220b of the second part 220 of the dielectric structure 200, which constitutes the gate dielectric of the transistor structure 1000 and the final sidewall oxide of the diode structure 310.

The field dielectric layer 220a constituting the second part 220 of the dielectric structure 200 at a sidewall part of the shield electrode 330 and the bottom wall part between the bottom of the trench structure T or the gate trench structure GT and the shield electrode 330 may be formed by a thermal oxidation process. The bottom field oxide thickness of the second part 220 of the dielectric structure 200 between the bottom of the trench structure T and the gate trench structure GT and the shield electrode 330 may be in a range between 100 nm to 1000 nm. The oxide layer of the first part 210 of the dielectric structure 200 may be formed by a gate oxidation or deposition process. The oxide layer of the second part 220 of the dielectric structure 200 may be formed as a field oxide layer by a thermal oxidation or deposition process, for example.

Figure 7D:
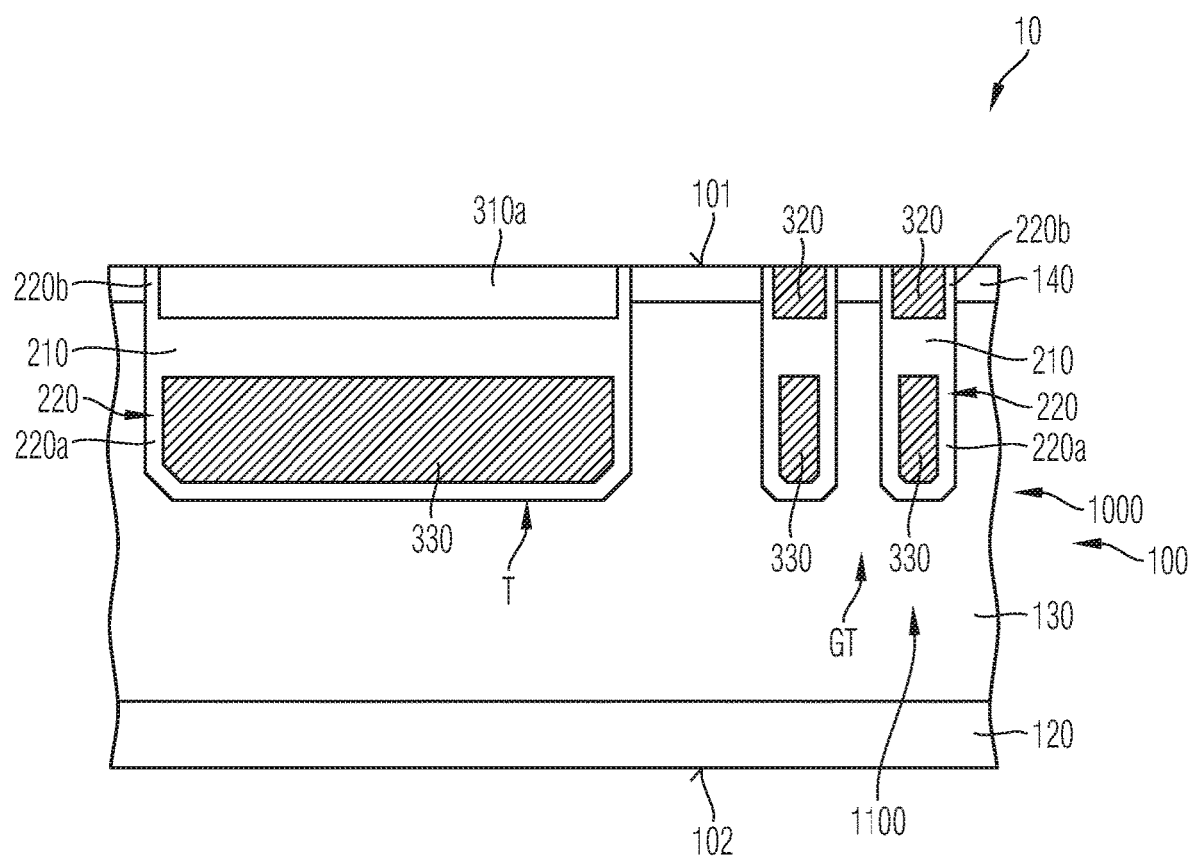

Referring to FIG. 7D, polycrystalline silicon is deposited on the surface of the semiconductor body 100 until the trench structure T and the gate trench structure GT are filled. Thereafter, polycrystalline silicon above the trench structure T and the gate trench structure GT is removed such that the polycrystalline silicon in the gate trench structure GT and the polycrystalline silicon in the trench structure T are separated from one another. Removal of the polycrystalline silicon may be carried out by a chemical mechanical polishing process. Instead of a chemical mechanical polishing process, also a plasma etching process may be performed. The dimension along a vertical direction of the polycrystalline silicon of the diode structure 310 and the gate electrode 320 may be in a range between 200 nm to 1000 nm or 200 nm to 600 nm.

Furthermore, the gate dielectric layer 220b of the second part 220 of the dielectric structure 200 is formed. The thickness of the gate dielectric layer 220b of the second part 220 of the dielectric structure 200 constituting the gate dielectric may be in a range between 5 nm to 200 nm or 40 nm to 120 nm, or in a range between 60 nm to 100 nm. The sidewall thickness of the second part 220 of the dielectric structure 200 being arranged between the sidewall of the diode structure 310 in the trench structure T may be in a range between 5 nm to 200 nm or 40 nm to 120 nm, or in a range between 60 nm to 100 nm.

After this, masked implantation may be applied, for highly doping the polycrystalline silicon in the gate trench structure GT constituting the gate electrode 320, in order to get a low gate electrode network resistance, followed by a thermal activation process.

Figure 7E:
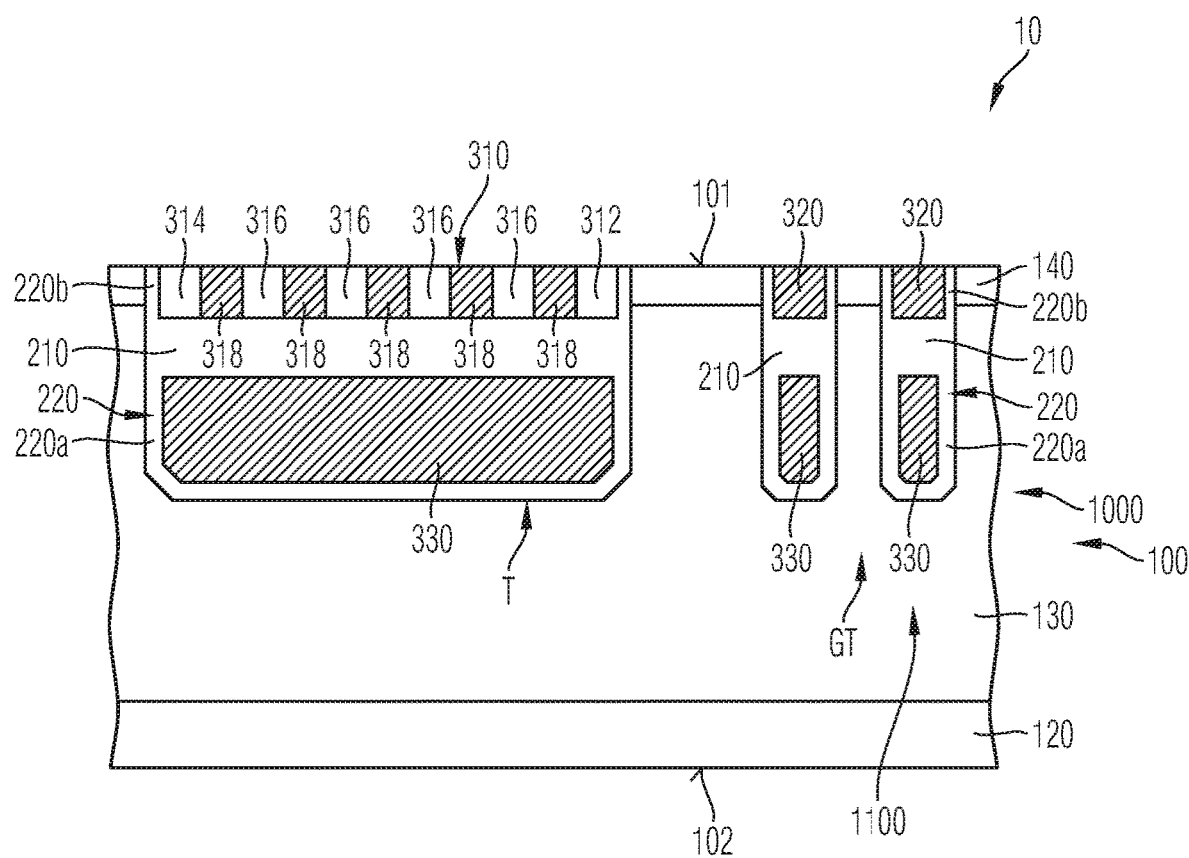

Referring to FIG. 7E, a back to back-diode chain is formed within a polycrystalline silicon layer 300 remaining in the trench structure T. Regarding the processes depicted in FIG. 7B to FIG. 7E, other optional processes may be carried out.

According to a first option, the trench structure T and the gate trench structure GT may be formed in different etching processes and not simultaneously, as illustrated in FIG. 7C. Furthermore, also the deposition or generation of the dielectric structure 200 and the deposition of the polycrystalline silicon may be performed separately for the transistor structure 1000 and the diode structure 310 accommodated in the trench structure T.

According to a second option, the deposition of polycrystalline silicon depicted in FIG. 7D may be performed separately for the gate trench structure GT and the trench structure T. In case of performing such a separate polysilicon deposition, in a first process, an in-situ highly doped gate polycrystalline silicon is deposited and in a second process, undoped Zener polycrystalline silicon followed by P and B implantations for the monolithically integrated Zener diode may be carried out.

According to a third option, only one polycrystalline silicon layer 300 is deposited for both the gate trench structure GT and the trench structure T. According to this option, an undoped or weakly n-doped polycrystalline silicon layer 300 may be deposited on the surface of the semiconductor body 100 to fill the trench structure T and the gate trench structure GT. Thereafter, P or As ions may be used to dope the undoped or weakly n-doped polycrystalline silicon layer 300 in an ion implantation process. Herein, the dopant concentration in the gate electrode 320 within the gate trench structure GT may be at least ten times larger than the net dopant concentration of the n-doped first regions 316 of the back to back-diode chain within the trench structure T.

The net dopant concentration of the polycrystalline silicon layer 300 of the first conductivity type, for example an n-type, may be in a range from $5 \times 10^{16}$ cm$^{-3}$ to $5 \times 10^{19}$ cm$^{-3}$, or in a range from $5 \times 10^{16}$ cm$^{-3}$ to $5 \times 10^{18}$ cm$^{-3}$, or in a range from $1 \times 10^{17}$ cm$^{-3}$ to $1 \times 10^{18}$ cm$^{-3}$. The net dopant concentration of the first conductivity type in the gate electrode 320 within the gate trench structure GT may be larger than $1 \times 10^{19}$ cm$^{-3}$, or higher than $5 \times 10^{19}$ cm$^{-3}$, or larger than $1 \times 10^{20}$ cm$^{-3}$. The net dopant concentration of the first conductivity type in the polysilicon material in the gate trench structure GT may be larger than $5 \times 10^{20}$ cm$^{-3}$. According to an embodiment, the n$^+$-doped polycrystalline silicon material may be doped with phosphorus or arsenic. Thereafter, boron ions may be used to dope the higher p-doped polycrystalline silicon layer regions 318 in an ion implantation process (FIG. 7E). The net dopant concentration of the second regions 318 of the second conductivity type, for example an p-type, may be in a range from $1 \times 10^{18}$ cm$^{-3}$ to $1 \times 10^{21}$ cm$^{-3}$, or in a range from $1 \times 10^{19}$ cm$^{-3}$ to $1 \times 10^{20}$ cm$^{-3}$.

Figure 7F:
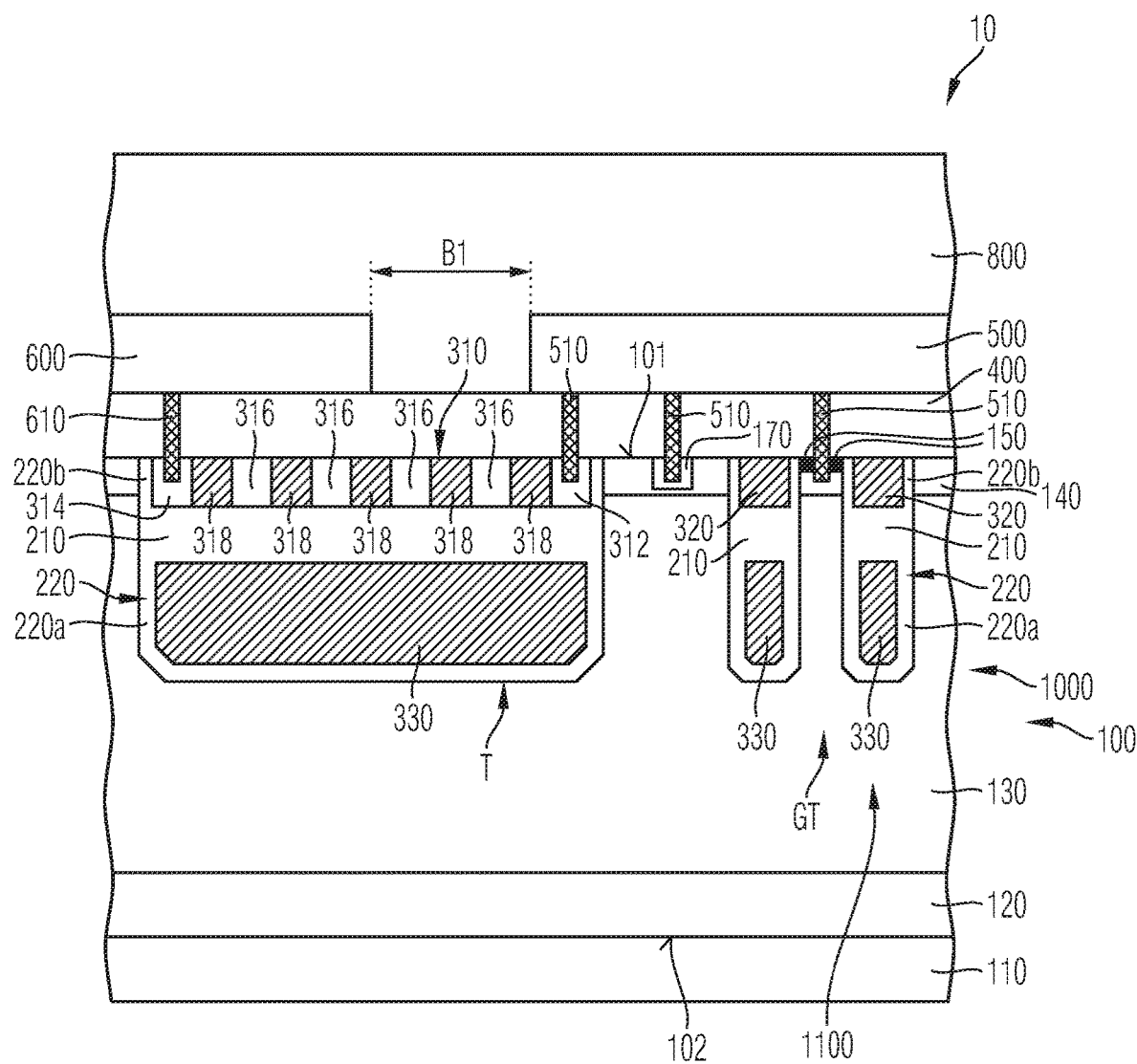

Referring to FIG. 7F, the source regions 150 as well as the body contact region 170 are formed by implantation through the first surface 101 of the semiconductor body 100. Referring to FIG. 7F, further processes are carried out, for example deposition of the isolation layer 400, and formation of the gate contact structure 600 and the source contact structure 500. In addition, a drain contact structure 110 is formed on the backside or on the second surface 102 of the semiconductor body 100.

Figure 7G:
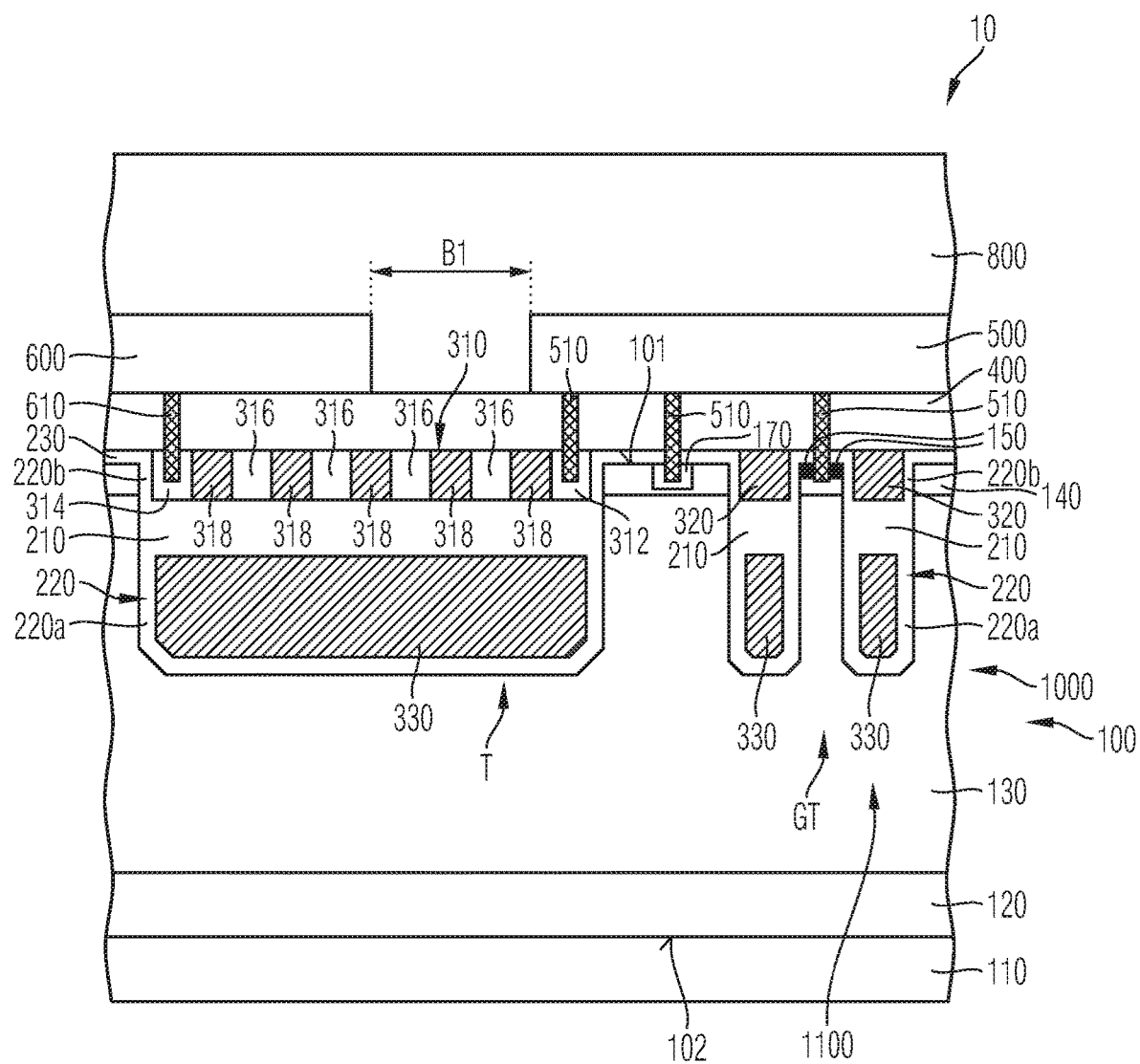

Referring to FIG. 7G, according to another embodiment, the planar top side of the gate electrode 320 and the diode structure 310 may not be flush with the first surface 101 of the semiconductor body 100, but may protrude from the first surface 101 and may be flush with a dielectric intermediate layer 230, the dielectric intermediate layer 230 lining the first surface 101 of the semiconductor body 100. Thus, the diode structure 310 may have a planar top side being parallel to the first surface 101. Further, the gate electrode 320 may have a planar top side being parallel with the first surface 101.

For the monolithic integration of electrostatic discharge protection elements in superjunction metal oxide semiconductor (MOS) transistors, Trench field effect transistors (FET) or insulated gate bipolar transistors (IGBT), an efficient utilization of the chip area is important. In particular, small chips with small capacitances Ciss, Crss, Coss and thin gate oxides (for example 20 nm-120 nm) need additional protection elements against human body model-electrostatic discharge (HBM-ESD) events.

For lower breakdown voltages (for example 20V-300V) Trench MOS devices are commonly used. Due to the reduction of the junction field effect JFET effect, a higher integration density is possible. Consequently, the requirements on photolithographic accuracy increases. Thus, planarization techniques like chemical mechanical polishing (CMP) are typically used. Instead of a chemical mechanical polishing process, also a plasma etching process may be performed.

For the reduction of the Miller capacitance (CGD), a thick oxide at the gate trench bottom is implemented. By additional introduction of a source polysilicon shielding plate underneath the gate electrode, a further reduction of the Miller capacitance is obtained.

The monolithic integration of gate/source electrostatic discharge (ESD) human body model (HBM) protection diodes in trench gate-based power field effect transistors (FET) is regarded. The process topology is compatible to chemical mechanical polishing (CMP) processing. Furthermore, the electrostatic discharge diode structure is shielded against electrical vertical or lateral drain potential.

A monolithic integration of lateral polycrystalline silicon back-to-back diode chains in gate trenches lined with a dielectric material has been described, which are electrically shielded from backside drain potentials by a buried, highly doped polysilicon "source" field plate.

To improve electrical shielding, the diode can be combined with a p-region connected to the field plate (source) potential which reaches deeper than the ESD protection diode poly silicon electrode thereby providing shielding from the side regions in addition to the field plate shielding from the bottom.

These shielded diodes enable an, electrostatic discharge-human body model (ESD-HBM) capability and a nearly planar surface of trench gate Silicon power technologies for process compatibility with chemical mechanical polishing (CMP) techniques.

Alternatively or in addition, polysilicon trench gate resistors can be integrated between gate pad and metal gate runner. This principle is also applicable for metal oxide semiconductor field effect transistors (MOSFET) or insulated gate bipolar transistors (IGBT) with trench cells in silicon and silicon carbide technology.

Due to the monolithic integration of a bidirectional electrostatic discharge (ESD) protection structure into the gate trenches of trench power devices, an electrostatic discharge (ESD) human body model (HBM) capability, electrical shielding of the diode against backside and lateral drain potential without extra processing, and chemical mechanical polishing compatible planar surface topology can be obtained. Instead of a chemical mechanical polishing process, also a plasma etching process may be performed.

The implementation of the ESD protection diode for gate/source electrostatic discharge (ESD) protection may be done into the upper gate trench inside the gate polysilicon layer or an additional ESD protection diode polysilicon layer, which is in-situ-doped or doped by implantation with a lower doping concentration than the ordinary gate polysilicon layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a trench structure extending into a semiconductor body from a first surface, the trench structure comprising a shield electrode, a dielectric structure and a diode structure,
    a gate trench structure extending into the semiconductor body, the gate trench structure comprising a gate electrode of a transistor structure that is configured to control a load current between source and drain regions that are disposed in the semiconductor body,
    an electrically insulating isolation layer formed on the first surface of the semiconductor body,
    a source contact structure formed on the electrically insulating isolation layer in a first lateral region and electrically connected to the source region,
    a gate contact structure formed on the electrically insulating isolation layer in a second lateral region and electrically connected to the gate electrode,
    a lateral gap between the source and gate contact structures,
    wherein the trench structure comprises a first end that is directly below the source contact structure, a second end that is directly below the gate contact structure, and a middle region that is directly below the lateral gap,
    wherein a first terminal of the diode structure is electrically connected to the source contact structure by a first electric contact structure that extends through the isolation layer and directly contacts the first end and the source contact,
    wherein a second terminal of the diode structure is electrically connected to the gate contact structure by a second electric contact structure that extends through the isolation layer and directly contacts the second end and the gate contact,
    wherein the diode structure is arranged at least partly between the first surface and a first part of the dielectric structure,
    wherein the shield electrode is arranged between the first part of the dielectric structure and a bottom of the trench structure,
    wherein the shield electrode and the semiconductor body are electrically isolated by the dielectric structure.

2. The semiconductor device of claim 1,
    wherein the gate trench structure comprises a shield electrode, and a dielectric structure,
    wherein the gate electrode is arranged between the first surface and the first part of the dielectric structure,
    wherein the shield electrode of the gate trench structure is arranged between the first part of the dielectric structure of the gate trench structure and a bottom of the gate trench structure.

3. The semiconductor device of claim 2, wherein a second part of the dielectric structure of the trench structure lines an inner surface of the trench structure.

4. The semiconductor device of claim 2, wherein a second part of the dielectric structure of the gate trench structure lines an inner surface of the gate trench structure and forms a gate dielectric of the transistor structure.

5. The semiconductor device of claim 2, wherein the trench structure and the gate trench structure have a same depth.

6. The semiconductor device of claim 5, wherein the trench structure comprises a plurality of longitudinal trenches each of which accommodates a back-to-back diode chain.

7. The semiconductor device of claim 6, wherein the longitudinal trenches each have a length along a longitudinal direction of the longitudinal trenches within a lateral plane and each have a width perpendicular to a longitudinal direction of the longitudinal trenches within a lateral plane, and wherein a ratio between the length and the width is in a range between 5 to 50.

8. The semiconductor device of claim 1, wherein the shield electrode of the trench structure and the gate trench structure comprises a polycrystalline silicon material.

9. The semiconductor device of claim 1, wherein a net dopant concentration of the shield electrode of the trench structure is greater than $1 \times 10^{19}$ cm$^{-3}$.

10. The semiconductor device of claim 1, wherein the diode structure comprises a polycrystalline silicon layer having first regions and at least one second region of opposite conductivity type alternately arranged to form a back-to-back diode chain.

11. The semiconductor device of claim 1, wherein the diode structure is arranged along a direction being parallel to the first surface.

12. The semiconductor device of claim 1, wherein the diode structure has a planar top side parallel with the first surface.

13. The semiconductor device of claim 1, wherein the trench structure is surrounded by a well region in the semiconductor body.

14. The semiconductor device of claim 13, wherein the well region extends deeper into the semiconductor body than the diode structure.

15. The semiconductor device of claim 1, wherein the lateral gap comprises first and second elongated regions, wherein in a direction parallel to the first surface the first and second elongated regions are angled relative to one another and intersect with one another, wherein the semiconductor device comprises a plurality of the trench structures, wherein a first one of the trench structures extends transversely across the first elongated region, and wherein a second one of the trench structures extends transversely across the second elongated region.

16. The semiconductor device of claim 1, wherein the semiconductor device comprises a plurality of the gate trench structures, each of the gate trench structures in the plurality extending lengthwise parallel to one another in a first direction, and wherein the trench structure extends lengthwise in a second direction, wherein the second direction is transverse to the first direction.

17. A semiconductor device, comprising:
a trench structure extending into a semiconductor body from a first surface, the trench structure comprising a shield electrode, a dielectric structure and a diode structure,
a gate trench structure extending into the semiconductor body, the gate trench structure comprising a gate electrode of a transistor structure that is configured to control a load current between source and drain regions that are disposed in the semiconductor body,
an electrically insulating isolation layer formed on the first surface of the semiconductor body,
a source contact structure formed on the electrically insulating isolation layer in a first lateral region and electrically connected to the source region,
a gate contact structure formed on the electrically insulating isolation layer in a second lateral region and electrically connected to the gate electrode,
a lateral gap between the source and gate contact structures,
wherein the trench structure comprises a first end that is directly below the source contact structure, a second end that is directly below the gate contact structure, and a middle region that is directly below the lateral gap,
wherein a first terminal of the diode structure is electrically connected to the source contact structure by a first electric contact structure that extends through the isolation layer and directly contacts the first end and the source contact,
wherein a second terminal of the diode structure is electrically connected to the gate contact structure by a second electric contact structure that extends through the isolation layer and directly contacts the second end and the gate contact,
wherein the diode structure comprises a polycrystalline silicon layer having first regions and at least one second region of opposite conductivity type alternately arranged to form a back-to-back diode chain in the trench structure,
wherein the polycrystalline silicon layer is spaced apart from the shield electrode by the dielectric structure,
wherein the shield electrode is disposed below the diode structure and electrically isolated from the semiconductor body by the dielectric structure.

18. The semiconductor device of claim 17, wherein the lateral gap comprises first and second elongated regions, wherein in a direction parallel to the first surface the first and second elongated regions are angled relative to one another and intersect with one another, wherein the semiconductor device comprises a plurality of the trench structures, wherein a first one of the trench structures extends transversely across the first elongated region, and wherein a second one of the trench structures extends transversely across the second elongated region.

19. The semiconductor device of claim 17, wherein the transistor structure comprises a plurality of the gate trench structures, each of the gate trench structures in the plurality extending lengthwise parallel to one another in a first direction, and wherein the trench structure extends lengthwise in a second direction, wherein the second direction is transverse to the first direction.

20. A method for manufacturing a semiconductor device, the method comprising:
forming a trench structure extending into a semiconductor body from a first surface; and
forming, in the trench structure, a shield electrode, a dielectric structure, and a diode structure,
forming a gate trench structure extending into the semiconductor body, the gate trench structure comprising a gate electrode of a transistor structure that is configured to control a load current between source and drain regions that are disposed in the semiconductor body,
forming an electrically insulating isolation layer formed on the first surface of the semiconductor body,
forming a source contact structure on the electrically insulating isolation layer in a first lateral region and electrically connected to the source region,
forming a gate contact structure on the electrically insulating isolation layer in a second lateral region and electrically connected to the gate electrode,
forming a lateral gap between the source and gate contact structures,
wherein the trench structure comprises a first end that is directly below the source contact structure, a second end that is directly below the gate contact structure, and a middle region that is directly below the lateral gap,
wherein a first terminal of the diode structure is electrically connected to the source contact structure by a first electric contact structure that extends through the isolation layer and directly contacts the first end and the source contact,
wherein a second terminal of the diode structure is electrically connected to the gate contact structure by a second electric contact structure that extends through the isolation layer and directly contacts the second end and the gate contact,
wherein the diode structure is arranged at least partly between the first surface and a first part of the dielectric structure,
wherein the shield electrode is arranged between the first part of the dielectric structure and a bottom of the trench structure,
wherein the shield electrode and the semiconductor body are electrically isolated by the dielectric structure.

21. The method of claim 20, further comprising:
simultaneously forming the trench structure and a gate trench structure extending into the semiconductor body from the first surface;
applying polycrystalline silicon on the first surface of the semiconductor body to fill the trench structure and the gate trench structure;
removing the polycrystalline silicon to a predetermined trench depth to form the shield electrode in the trench structure and the gate trench structure;
forming the first part of the dielectric structure on the shield electrode in the trench structure and the gate trench structure;
applying polycrystalline silicon on the first part of the dielectric structure to fill the trench structure and the gate trench structure; and
carrying out a chemical mechanical polishing process or a plasma etching process to remove the polycrystalline silicon from above the trench structure and the gate trench structure, such that the polycrystalline silicon in the gate trench structure and the polycrystalline silicon in the trench structure are separated from one another.

22. The method of claim 21, wherein applying polycrystalline silicon on the first part of the dielectric structure comprises:
  filling the trench structure with polycrystalline silicon having a first net dopant concentration; and
  filling the gate trench structure with polycrystalline silicon having a second net dopant concentration at least ten times higher than the first net dopant concentration.

* * * * *